(12) United States Patent
Sheats et al.

(10) Patent No.: US 8,158,450 B1
(45) Date of Patent: Apr. 17, 2012

(54) BARRIER FILMS AND HIGH THROUGHPUT MANUFACTURING PROCESSES FOR PHOTOVOLTAIC DEVICES

(75) Inventors: James R. Sheats, Palo Alto, CA (US);
Paul Adriani, Palo Alto, CA (US);
Philip Capps, Mountain View, CA (US);
Martin R. Roscheisen, San Francisco, CA (US); Brian M. Sager, Menlo Park, CA (US)

(73) Assignee: Nanosolar, Inc., San Jose, CA (US)

( * ) Notice: Subject to any disclaimer, the term of this patent is extended or adjusted under 35 U.S.C. 154(b) by 1095 days.

(21) Appl. No.: 11/746,799

(22) Filed: May 10, 2007

Related U.S. Application Data

(63) Continuation-in-part of application No. 11/460,613, filed on Jul. 27, 2006, now abandoned, and a continuation-in-part of application No. 11/460,617, filed on Jul. 27, 2006, now abandoned, and a continuation-in-part of application No. 11/460,618, filed on Jul. 27, 2006, now abandoned, and a continuation-in-part of application No. 11/460,620, filed on Jul. 27, 2006, now abandoned, and a continuation-in-part of application No. 11/462,360, filed on Aug. 3, 2006, now abandoned, and a continuation-in-part of application No. 11/745,430, filed on May 7, 2007.

(60) Provisional application No. 60/746,626, filed on May 5, 2006, provisional application No. 60/746,629, filed on May 5, 2006, provisional application No. 60/746,961, filed on May 10, 2006, provisional application No. 60/804,570, filed on Jun. 12, 2006, provisional application No. 60/804,571, filed on Jun. 12, 2006, provisional application No. 60/806,096, filed on Jun. 28, 2006.

(51) Int. Cl.
*H01L 21/00* (2006.01)
(52) U.S. Cl. ............... 438/57; 438/66; 438/80; 136/259
(58) Field of Classification Search .................. None
See application file for complete search history.

(56) References Cited

U.S. PATENT DOCUMENTS 3,903,427 A 9/1975 Pack
(Continued)

FOREIGN PATENT DOCUMENTS

WO 0078540 A1 12/2000

OTHER PUBLICATIONS

Alan Sellinger et al., "Continuous Self-Assembly of Organic-Inorganic Nanocomposite Coatings that Mimic Nacre", Nature, vol. 394,J)Q. 256-260, Macmillan Publishers Ltd, Jul. 16, 1998.

(Continued)

*Primary Examiner* — David E Graybill

(57) ABSTRACT

Methods and devices are provided for improved roofing devices. In one embodiment of the present invention, a photovoltaic roofing assembly is provided that comprises of a roofing membrane and a plurality of photovoltaic cells supported by the roofing membrane. The photovoltaic cells may be lightweight, flexible cells formed on a lightweight foil and disposed as a layer on top of the roofing membrane. The roofing assembly may include at least one flexible encapsulant film that protects the plurality of photovoltaic cells from environmental exposure damage, wherein the encapsulant film is formed using a non-vacuum process. Optionally, the process may be a lamination process. In other embodiments, the process is a non-vacuum, non-lamination process. The resulting roofing membrane and the photovoltaic cells are constructed to be rolled up in lengths suitable for being transported to a building site for unrolling and being affixed to a roof structure.

11 Claims, 12 Drawing Sheets

U.S. PATENT DOCUMENTS

| | | | |
|---|---|---|---|
| 4,869,755 | A | 9/1989 | Huschka et al. |
| 5,372,888 | A | 12/1994 | Ogawa et al. |
| 5,419,782 | A | 5/1995 | Levine et al. |
| 5,554,670 | A | 9/1996 | Giannelis et al. |
| 5,656,098 | A | 8/1997 | Ishikawa et al. |
| 5,681,666 | A | 10/1997 | Treger et al. |
| 6,057,035 | A | 5/2000 | Singh et al. |
| 6,133,522 | A | 10/2000 | Kataoka et al. |
| 6,146,224 | A | 11/2000 | McCarthy |
| 6,264,741 | B1 | 7/2001 | Brinker et al. |
| 6,268,014 | B1 | 7/2001 | Eberspacher et al. |
| 6,413,645 | B1 | 7/2002 | Graff et al. |
| 6,472,467 | B1 | 10/2002 | Chiao |
| 6,573,652 | B1 | 6/2003 | Graff et al. |
| 6,623,861 | B2 | 9/2003 | Martin et al. |
| 6,727,513 | B2 | 4/2004 | Fujimori et al. |
| 6,818,163 | B1 | 11/2004 | Fibiger et al. |
| 6,866,901 | B2 | 3/2005 | Burrows et al. |
| 2001/0011552 | A1 | 8/2001 | Morizane et al. |
| 2001/0054262 | A1 | 12/2001 | Nath et al. |
| 2002/0050287 | A1 | 5/2002 | Yamada et al. |
| 2004/0035460 | A1 | 2/2004 | Gonsiorawski |
| 2004/0187917 | A1 | 9/2004 | Pichler |
| 2005/0062174 | A1 | 3/2005 | Ingle |
| 2005/0095422 | A1 | 5/2005 | Sager et al. |
| 2007/0000537 | A1 | 1/2007 | Leidholm et al. |
| 2007/0295385 | A1* | 12/2007 | Sheats et al. .......... 136/251 |
| 2007/0295386 | A1* | 12/2007 | Capps et al. .......... 136/251 |
| 2007/0295387 | A1* | 12/2007 | Adriani et al. .......... 136/251 |
| 2007/0295388 | A1* | 12/2007 | Adriani et al. .......... 136/251 |
| 2007/0295389 | A1* | 12/2007 | Capps et al. .......... 136/251 |
| 2007/0295390 | A1* | 12/2007 | Sheats et al. .......... 136/251 |

OTHER PUBLICATIONS

Notice of Allowance and Office Action for U.S. Appl. No. 11/462,359 dated Jun. 15, 2011, Jan. 22, 2010, Apr. 9, 2009, and Jul. 22, 2008.

Office Actions from U.S. Appl. No. 11/460,613 dated May 27, 2009 and Aug. 20, 2008.

Office Actions from U.S. Appl. No. 11/460,617 dated Jun. 8, 2009 and Aug. 19, 2008.

Office Actions from U.S. Appl. No. 11/460,618 dated Jun. 8, 2009 and Aug. 21, 2008.

Office Actions from U.S. Appl. No. 11/462,360 dated May 28, 2009 and Aug. 20, 2008.

Office Actions from U.S. Appl. No. 11/745,430 dated Feb. 16, 2011 and Jun. 8, 2010.

* cited by examiner

BARRIER FILMS AND HIGH THROUGHPUT MANUFACTURING PROCESSES FOR PHOTOVOLTAIC DEVICES

CROSS-REFERENCE TO RELATED APPLICATIONS

This patent application claims the benefit of priority to commonly assigned, copending U.S. Provisional Application Ser. No. 60/746,626 and 60/746,629 both filed May 5, 2006; commonly assigned, copending U.S. Provisional Application Ser. No. 60/746,961 filed May 10, 2006; commonly assigned, copending U.S. Provisional Application Ser. No. 60/804,570 filed Jun. 12, 2006; commonly assigned, copending U.S. Provisional Application Ser. No. 60/804,571 filed Jun. 12, 2006; and commonly assigned, copending U.S. Provisional Application Ser. No. 60/806,096 filed Jun. 28, 2006. This application is also a continuation-in-part of copending U.S. patent application Ser. Nos. 11/460,613, 11/460,617, 11/460,618, and 11/460,620 all filed one Jul. 27, 2006 now abandoned. This application is also a continuation-in-part of copending U.S. patent application Ser. No. 11/462,360 filed Aug. 3, 2006 now abandoned and U.S. patent application Ser. No. 11/745,430 filed May 7, 2007. All of the foregoing applications are fully incorporated herein by reference for all purposes.

FIELD OF THE INVENTION

This invention relates generally to photovoltaic devices, and more specifically, to flexible photovoltaic roofing assemblies with improved barrier films formed by high throughput manufacturing techniques.

BACKGROUND OF THE INVENTION

Solar cells and solar modules convert sunlight into electricity. These electronic devices have been traditionally fabricated using silicon (Si) as a light-absorbing, semiconducting material in a relatively expensive production process. To make solar cells more economically viable, solar cell device architectures have been developed that can inexpensively make use of thin-film, light-absorbing semiconductor materials such as copper-indium-gallium-sulfo-di-selenide, $Cu(In, Ga)(S, Se)_2$, also termed CI(G)S(S). This class of solar cells typically has a p-type absorber layer sandwiched between a back electrode layer and an n-type junction partner layer. The back electrode layer is often Mo, while the junction partner is often CdS. A transparent conductive oxide (TCO) such as zinc oxide ($ZnO_x$) is formed on the junction partner layer and is typically used as a transparent electrode.

Although these thin-film based solar cells are known devices, it remains a challenge to cost-effectively produce these cells in sufficient volume with efficiencies greater than or equivalent to their silicon-based counterparts. Because of the difficulties in producing these thin-film cells in volume, many industrial applications of solar cells have continued to be based on traditional silicon-based solar cells with rigid substrates. Certainly, the use of traditional silicon-based solar cells with rigid substrates is a safe, conservative choice based on well understood technology. Traditional solar cells are based on rigid glass substrates using silicon absorber layers and further include rigid glass top layers to provide environmental and structural protection to the underlying silicon based cells.

Drawbacks associated with these rigid cells, however, make them suboptimal choices for applications that require lightweight and/or flexible devices. This may be particularly true for roofing assemblies where it is desirable to have lightweight devices that minimize the load on the roofing support members. From a structural integrity perspective, it is desirable to use materials more robust than glass substrates associated with rigid cells which, in addition to its weight, is also subject to cracking or shattering. From an installation perspective, it is easier to work with a flexible, lightweight substrate that can integrate well with known roofing membranes that are unrolled to cover large areas of a roofing surface.

Furthermore, even if such flexible device were efficiently produced, the types of protective encapsulant materials available today are not well suited for use with such flexible solar cells. Conventional solar cells are usually encapsulated with glass, which is mechanically sturdy (when in a tempered form), impermeable to water vapor and other gases, and suffers no change in optical clarity due to ultraviolet exposure. However, as discussed above, it is also is heavy, expensive, rigid, and fragile. Alternatively, polymer layers are flexible, and many polymers are cheaper than glass, are far lighter, and are not breakable. However, polymers have poorer barrier qualities and may be permeable to small molecule gases such as water and oxygen. Polymers may also be difficult to seal to each other at the edges so that gas intrusion is prevented along the plane of a lamination, and many of them are photochemically reactive and degrade in either flexibility or clarity, or both, by ultraviolet exposure over a period of years or even less. Accordingly, there is a pressing need for improved transparent protective film which can provide improved protection while maintaining flexibility and is suitable for high throughput manufacturing processes.

There remains substantial improvement that can be made to existing photovoltaic roofing assemblies and roofing membranes that can greatly increase their ease of installation, reduce their cost of manufacturing, increase their power density, and improve their durability which should increase market penetration and commercial adoption of such products.

SUMMARY OF THE INVENTION

Embodiments of the present invention address at least some of the drawbacks set forth above. The present invention provides for the use of lightweight thin film solar cells in roofing assemblies such as roofing membranes. The present invention may also provide improved encapsulant barrier layers suitable for use with flexible photovoltaic devices. At least some of these and other objectives described herein will be met by various embodiments of the present invention.

In one embodiment of the present invention, a photovoltaic roofing assembly is provided that comprises of a roofing membrane and a plurality of photovoltaic cells supported by the roofing membrane. The photovoltaic cells may be lightweight, flexible cells formed on a lightweight foil and disposed as a layer on top of the roofing membrane. The roofing assembly may include at least one flexible encapsulant film that protects the plurality of photovoltaic cells from environmental exposure damage, wherein the encapsulant film is formed using a non-vacuum process. Optionally, the process may be a lamination process. In other embodiments, the process is a non-vacuum, non-lamination process. The resulting roofing membrane and the photovoltaic cells are constructed to be rolled up in lengths suitable for being transported to a building site for unrolling and being affixed to a roof structure.

For any of the embodiments disclosed herein, any of the following may apply. The encapsulant film may be comprised of a plurality of discrete nanolaminate layers, wherein the nanolaminate layers are assembled in a configuration of alternating organic material layers and inorganic material layers. The nanolaminate layer may be characterized by a plurality of randomly distributed pinholes in the nanolaminate layers which define a plurality of tortuous paths that impede contaminant penetration. The organic material layer may consist essentially of an organic material. The inorganic material layer may consist essentially of an inorganic material. The organic material may be a polymer or a hydrophobic polymer. The encapsulant film may be comprised of a plurality of templated-nanolaminate layers, wherein a plurality of beads are included to improve encapsulant film impermeability. The beads may be comprised of a silica-based material. The beads may have a higher density than sol-gel glass (1.7 g/cc). The beads may have a plurality of nanolaminate layers formed concentrically about each of the beads. A plurality of nanolaminate layers may be formed concentrically about each of the beads alternate between layers of inorganic material and layers of organic material. The templated-nanolaminate layers define a plurality of tortuous paths from an outside of the nanolaminate layers towards a bead. The templated-nanolaminate layers may drive contaminants penetrating an outer surface of the nanolaminate layers towards one of the beads, wherein contaminant molecules are trapped when the molecules reach the bead and cannot easily exit. The templated nanolaminate layer may be characterized by a plurality of randomly distributed pinholes in the concentric nanolaminate layers about each the beads, wherein the pinholes define a plurality of tortuous paths that impede contaminant penetration and direct contaminants away from the photovoltaic cells and towards the beads. The tortuous path length per unit coating volume in a templated-nanolaminate layer may be greater than a tortuous path length for a non-templated-nanolamiante layer of substantially equivalent shape and volume.

Optionally, any of the following may apply to any embodiments disclosed herein. The encapsulant film may be comprised of a molecular waveguide directing contaminants away from the photovoltaic cells to minimize exposure damage to the underlying photovoltaic cells. The encapsulant film may be comprised of a molecular waveguide having a plurality of beads each surrounded by a plurality of nanolaminate layers, wherein the beads and nanolaminate layers are coupled together to form the encapsulant film. In other embodiments, the encapsulant film may be comprised of fused silica beads. The encapsulant film may be comprised of a composite wherein a majority of the volume is occupied by particles of glass and/or other transparent inorganic material and deposited as a thin film coating over the photovoltaic cells. The particles may have a shape selected from at least one of the following: spheres, platelets, flakes, ovals, cone, or combinations thereof. Optionally, the encapsulant film may be comprised of fused particles. The particles may be fused by a rapid thermal process at a temperature and/or duration that will not damage the underlying photovoltaic cells. The film may be substantially without pinholes and/or microvoids. The encapsulant film may optionally include one or more discrete layers comprising: i) at least a first layer having a first composition characterized by at least one of the following properties: scratch resistance, UV resistance, water diffusion resistance, or oxygen diffusion resistance; and ii) at least a second layer having a second composition which exhibits at least one of the following properties more strongly than the first layer and is not a main property of the first layer: scratch resistance, UV resistance, water diffusion resistance, or oxygen diffusion resistance. In some embodiments, the encapsulant film may include a polymer and/or a polymer pottant. The polymer pottant may avoid the use of edge sealing. Optionally, the encapsulant film may be comprised of a transparent PVC material.

In a still further embodiment of the present invention, a high throughput manufacturing method comprises providing a plurality of photovoltaic cells, coupling the cells to a roofing membrane; and forming at least one flexible encapsulant film. The encapsulant film is formed to protect the plurality of photovoltaic cells from environmental exposure damage and may be formed using a non-vacuum process. The forming step may be comprised of forming a plurality of discrete nanolaminate layers, wherein the nanolaminate layers self-assemble in a configuration of alternating organic material layers and inorganic material layers. Optionally, the forming step may be comprised of forming a templated nanolaminate barrier film having a plurality of beads with concentric nanolaminate layers about each of the beads, wherein the concentric nanolaminate layers self-assemble about each of the beads. In other embodiments, the forming step may be comprised of forming a fused silica barrier film. Optionally, the forming step may be comprised of forming a polymer-based barrier film. The method may involve using a solution deposition process to form the encapsulant film or using a dry powder process to deposit at least a portion of the encapsulant film.

For any of the embodiments disclosed herein, any of the following may apply. The forming step may use a non-vacuum, lamination process to form the encapsulant film. Optionally, the forming step may use a non-vacuum, non-lamination process to form the encapsulant film. In other embodiments, the encapsulant film may be formed using a non-vacuum, non-gluing process. In another embodiment, the method may involve incorporating one or more hydrophobic groups into the polymer precursors or eliminating one or more hydrophobic groups from the polymer precursors to increase and/or decrease the hydrophobicity of the organic layers. The forming step may include combining an alkoxide, an alcohol, water dilute HCl and heating the resulting mixture; introducing a coupling agent to the mixture; introducing a surfactant to the mixture in a quantity sufficient that the initial surfactant concentration is below the critical micelle concentration; adding to the mixture one or more polymer precursors suitable for the formation of a polymer selected from the group of, polyethylene naphthalate (PEN), polyether etherketone (PEEK), polyether sulfone (PES), fluorinated or non-fluorinated styrene polymer precursors, fluorinated or non-fluorinated methyl styrene polymer precursors, fluorinated or non-fluorinated (meth)acrylate polymer precursors, and combinations and/or derivatives of two or more of these precursors; adding a cross-linker agent and an initiator to the mixture; coating a substrate with the mixture; and allowing the alcohol to evaporate so that the sol forms a film having alternating organic and inorganic layers.

Optionally, any of the following may apply to any embodiments disclosed herein. The method may involve incorporating one or more hydrophobic groups into the polymer precursors or eliminating one or more hydrophobic groups from the polymer precursors to increase and/or decrease the hydrophobicity of the organic layers. The one or more hydrophobic groups may be selected from the group of non-polar hydrophobic groups, methyl groups, benzyl (aromatic) groups, $PO_4^{3-}$, $SO_4^{2-}$, $CH_3COO^-$, $Cl^-$, $Br^-$, $NO^-$, $ClO_4^-$, $I^-$, $SC_n^-$-anions, $NH_4^+$, $Rb^+$, $K^+$, $Na^+$, $Cs^+$, $Li^+$, $Mg^{2+}$, $Ca^{2+}$, $Ba^{2+}$ cations, tryptophan, isoleucine, phenylalanine, tyrosine, leucine, valine, methionine, alanine. The surfactant may include one or more Gemini surfactants. The method may include annealing the film at a temperature of about 125° C. to about 150° C. or greater and/or below the lowest decomposition temperature of any of the organic materials in the film. Forming the encapsulant film may comprise of depositing a mixture over the photovoltaic cells by dip coating, spin coating, spray coating, web coating, or microgravure web coating. Forming the encapsulant film may include forming a transparent PVC layer over the photovoltaic cells.

A further understanding of the nature and advantages of the invention will become apparent by reference to the remaining portions of the specification and drawings.

DESCRIPTION OF THE SPECIFIC EMBODIMENTS

Figure 1A:
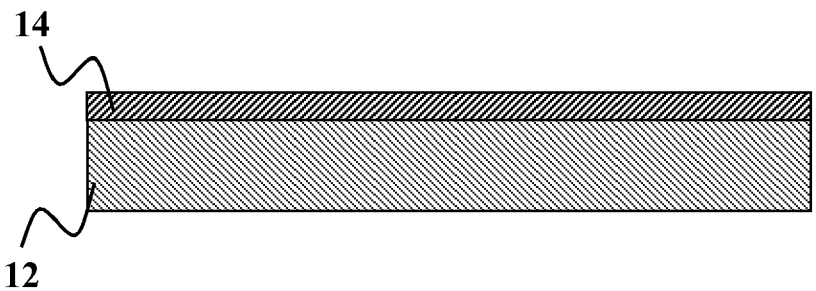
FIGS. 1A-1D are schematic cross-sectional diagrams illustrating fabrication of a film according to an embodiment of the present invention.

It is to be understood that both the foregoing general description and the following detailed description are exemplary and explanatory only and are not restrictive of the invention, as claimed. It may be noted that, as used in the specification and the appended claims, the singular forms "a", "an" and "the" include plural referents unless the context clearly dictates otherwise. Thus, for example, reference to "a material" may include mixtures of materials, reference to "a compound" may include multiple compounds, and the like. References cited herein are hereby incorporated by reference in their entirety, except to the extent that they conflict with teachings explicitly set forth in this specification.

In this specification and in the claims which follow, reference will be made to a number of terms which shall be defined to have the following meanings.

"Optional" or "optionally" means that the subsequently described circumstance may or may not occur, so that the description includes instances where the circumstance occurs and instances where it does not. For example, if a device optionally contains a feature for a barrier film, this means that the barrier film feature may or may not be present, and, thus, the description includes both structures wherein a device possesses the barrier film feature and structures wherein the barrier film feature is not present.

Referring now to FIG. 1, one embodiment of the present invention will now be described. According to embodiments of the present invention, an active layer for a photovoltaic device may be fabricated by first formulating an ink of particles (spherical or non-spherical) each containing at least one element from groups IB, IIIA and/or VIA, coating a substrate with the ink to form a precursor layer, and heating the precursor layer to form a dense film. Optionally, it should be understood that in some embodiments, densification of the precursor layer may not be needed, particularly if the precursor materials are oxygen-free and/or substantially oxygen-free. Thus, the heating step may optionally be skipped if the particles are processed air-free and are oxygen-free. In a preferred embodiment, the non-spherical particles are particles that are substantially planar in shape. The dense film may be processed in a suitable atmosphere to form a group IB-IIIA-VIA compound. The resulting group IB-IIIA-VIA compound is preferably a compound of Cu, In, Ga and selenium (Se) or sulfur S of the form $CuIn_{(1-x)}Ga_xS_{2(1-y)}Se_{2y}$, where $0 \leq x \leq 1$ and $0 \leq y \leq 1$. It should also be understood that the resulting group IB-IIIA-VIA compound may be a compound of Cu, In, Ga and selenium (Se) or sulfur S of the form $Cu_zIn_{(1-x)}Ga_xS_{2(1-y)}Se_{2y}$, where $0.5 \leq z \leq 1.5$, $0 \leq x \leq 1.0$ and $0 \leq y \leq 1.0$.

It should be understood that group IB, IIIA, and VIA elements other than Cu, In, Ga, Se, and S may be included in the description of the IB-IIIA-VIA materials described herein, and that the use of a hyphen ("—" e.g., in Cu—Se or Cu—In—Se) does not indicate a compound, but rather indicates a coexisting mixture of the elements joined by the hyphen. It is also understood that group IB is sometimes referred to as group 11, group IIIA is sometimes referred to as group 13 and group VIA is sometimes referred to as group 16. Furthermore, elements of group VIA (16) are sometimes referred to as chalcogens. Where several elements can be combined with or substituted for each other, such as In and Ga, or Se, and S, in embodiments of the present invention, it is not uncommon in this art to include in a set of parentheses those elements that can be combined or interchanged, such as (m, Ga) or (Se, S). The descriptions in this specification sometimes use this convenience. Finally, also for convenience, the elements are discussed with their commonly accepted chemical symbols. Group IB elements suitable for use in the method of this invention include copper (Cu), silver (Ag), and gold (Au). Preferably the group IB element is copper (Cu). Group IIIA elements suitable for use in the method of this invention include gallium (Ga), indium (In), aluminum (Al), and thallium (Tl). Preferably the group IIIA element is gallium (Ga) and/or indium (In). Group VIA elements of interest include selenium (Se), sulfur (S), and tellurium (Te), and preferably the group VIA element is either Se and/or S. It should be understood that mixtures such as, but not limited to, alloys, solid solutions, and compounds of any of the above can also be used.

Method of Forming a Film

Referring now to FIG. 1, one method of forming a semiconductor film according to the present invention will now be described. It should be understood that the present embodiment of the invention uses non-vacuum techniques to form the semiconductor film. Other embodiments, however, may form the film under a vacuum environment, and the present invention using non-spherical particles is not limited to only non-vacuum coating techniques.

As seen in FIG. 1, a substrate 12 is provided. By way of non-limiting example, the substrate 12 may be made of a metal or metal foil such as aluminum. In other embodiments, metals or metal foils comprised of materials such as stainless steel, molybdenum, titanium, copper, or alloys and/combinations of the foregoing may be used as the substrate 12. Alternatively, metallized plastic foils can be used as the substrate 12, where a thin metal layer is formed on the underlying plastic substrate. The thin metal layer may be any of a variety of metals and/or alloys including but not limited to stainless steel, molybdenum, titanium, copper, or combinations of the foregoing. Bimetallic, trimetallic, and/or multi-metallic materials may also be employed, where each metal forms a discrete layer adjacent to the other layer(s). These substrates may be in any of a variety of forms including but not limited to plates, foils, sheets, rolls, or the like. Depending on the material of the substrate 12, it may be useful to coat a surface of the substrate 12 with a contact layer 14 to promote electrical contact between the substrate 12 and the absorber layer that is to be formed on it. As a nonlimiting example, when the substrate 12 is made of aluminum, the contact layer 14 may be a layer of molybdenum. For the purposes of the present discussion, the contact layer 14 may be regarded as being part of the substrate. As such, any discussion of forming or disposing a material or layer of material on the substrate 12 includes disposing or forming such material or layer on the contact layer 14, if one is used. Optionally, other layers of materials may also be used with the contact layer 14 for insulation or other purposes and still considered part of the substrate 12. It should be understood that the contact layer 14 may comprise of more than one type or more than one discrete layer of material. Upon formation, said discrete layers may remain discrete, or intermix via diffusion or some other physical mechanism of intermixing.

Figure 1B:
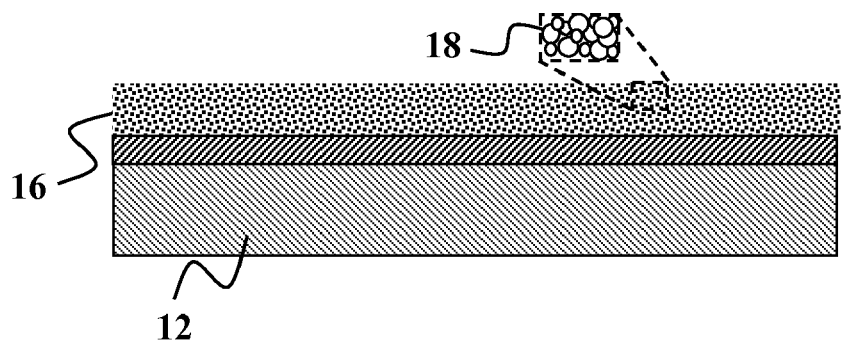

Referring now to FIG. 1B, a precursor layer 16 is formed over the substrate 12 by coating the substrate 12 with a dispersion such as but not limited to an ink. As one nonlimiting example, the ink may comprise of a carrier liquid mixed with the particles 18 and has a rheology that allows the ink to be coatable over the substrate 12. In on embodiment, the present invention may use dry powder mixed with the vehicle and sonicated before coating. Optionally, the inks may already formulated coming right from the mill. In the case of mixing, a plurality of flake compositions, the product may be mixed from various mills. This mixing could be sonicated but other forms of agitation and/or another mill may be used. The ink used to form the precursor layer 16 may contain non-spherical particles 18 such as microflakes, nanoflakes, core-shell particles of any of a variety of forms, and/or non-spheroids, and is not limited to spherical particles. It should also be understood that the ink may optionally use both non-spherical and spherical particles in any of a variety of relative proportions.

FIG. 1B includes a close-up view of the particles 18 in the precursor layer 16, as seen in the enlarged image. Particles have non-spherical shapes and are substantially planar on at least one side. A more detailed view of one embodiment of the particles 18 can be found in FIGS. 2A and 2B. Particles may be defined as particles having at least one substantially planar surface with a length and/or largest lateral dimension of about 500 nm or less and the particles has an aspect ratio of about 2 or more. In one embodiment, the length and/or largest lateral dimension is between about 400 nm and about 1 nm. In another embodiment, the length and/or largest lateral dimension is between about 300 nm and about 10 nm. In another embodiment, the length and/or largest lateral dimension is between about 200 nm and about 20 nm. In another embodiment, the length and/or largest lateral dimension is between about 500 nm and about 200 nm. In other embodiments, the particle is a substantially planar structure with thickness of between about 10 and about 100 nm and lengths between about 20 nm and 500 nm.

It should be understood that different types of particles 18 may be used to form the precursor layer 16. In one nonlimiting example, the particles are elemental particles, i.e., particles having only a single atomic species. The particles may be single metal particles of Cu, Ga, In or Se. Some inks may have only one type of particles. Other inks may have two or more types of particles which may differ in material composition and/or other quality such as but not limited to shape, size, interior architecture (e.g. a central core surrounded by one or more shell layers), exterior coating (be more explanatory on this one, maybe use words like core-shell), or the like. In one embodiment, the ink used for precursor layer 16 may contain particles comprising one or more group IB elements and particles comprising one or more different group IIIA elements. Preferably, the precursor layer 16 contains copper, indium and gallium. In another embodiment, the precursor layer 16 may be an oxygen-free layer containing copper, indium and gallium. Optionally, the ratio of elements in the precursor layer may be such that the layer, when processed, forms a compound of $CuIn_xGa_{1-x}$, where $0 \leq x \leq 1$. Those of skill in the art will recognize that other group IB elements may be substituted for Cu and other group IIIA elements may be substituted for In and Ga. Optionally, the precursor may contain Se as well, such as but not limited to Cu—In—Ga—Se plates. This is feasible if the precursor is substantially oxygen-free and densification is not needed. In still further embodiments, the precursor material may contain particles of group IB, IIIA, and VIA elements. In one nonlimiting example, the precursor may contain Cu—In—Ga—Se particles, which would be particularly advantageous if the particles are formed substantially oxygen-free and densification prior to film formation is not needed.

Optionally, the particles 18 in the ink may be alloy particles. In one nonlimiting example, the particles may be binary alloy particles such as Cu—In, In—Ga, or Cu—Ga. Alternatively, the particles may be a binary alloy of group IB, IIIA elements, a binary alloy of Group IB, VIA elements, and/or a binary alloy of group IIIA, VIA elements. In other embodiments, the particles may be a ternary alloy of group IB, IIIA, and/or VIA elements. For example, the particles may be ternary alloy particles of any of the above elements such as but not limited to Cu—In—Ga. In other embodiments, the ink may contain particles that are a quaternary alloy of group IB, IIIA, and/or VIA elements. Some embodiments may have quaternary or multi-nary particles. The ink may also combine particles of different classes such as but not limited to elemental particles with alloy particles or the like. In one embodiment, the particles used to form the precursor layer 16 preferably contains no oxygen other than those amounts unavoidably present as impurities. Optionally, the microflakes contain less than about 0.1 wt % of oxygen. In other embodiments, the microflakes contain less than about 0.5 wt % of oxygen. In still further embodiments, the microflakes contain less than about 1.0 wt % of oxygen. In yet another embodiment, the microflakes contain less than about 3.0 wt % of oxygen. In other embodiments, the microflakes contain less than about 5.0 wt % of oxygen.

Optionally, the particles 18 in the ink may be chalcogenide particles, such as but not limited to, a group IB or group IIIA selenide. In one nonlimiting example, the particles may be a group IB-chalcogenide formed with one or more elements of group IB (new-style: group 11), e.g., copper (Cu), silver (Ag), and gold (Au). Examples include, but are not limited to, $Cu_xSe_y$, wherein x is in the range of about 1 to 10 and y is in the range of about 1 to 10. In some embodiments of the present invention, x<y. Alternatively, some embodiments may have selenides that are more selenium rich, such as but not limited to, $Cu_1Se_x$ (where x>1). This may provide an increased source of selenium as discussed in commonly assigned, co-pending U.S. patent application Ser. No. 11/36, 1522 (Attorney Docket No. NSL-046) filed on Feb. 23, 2006 and fully incorporated herein by reference. In another non-limiting example, the particles may be a group IIIA-chalcogenide formed with one or more elements of group IIIA (new style: group 16), e.g., aluminum (Al), indium (In), gallium (Ga), and thallium (Tl). Examples include $In_xSe_y$ and $Ga_xSe_y$, wherein x is in the range of about 1 to about 10 and y is in the range of about 1 to about 10. Still further, the particles may be a Group IB-IIIA-chalcogenide compound of one or more group IB elements, one or more group IIIA elements and one or more chalcogens. Examples include CuInGa—$Se_2$. Other embodiments may replace the selenide component with another group VIA element such as but not limited to sulfur, or combinations of multiple group VIA elements such as both sulfur and selenium.

Figure 1C:
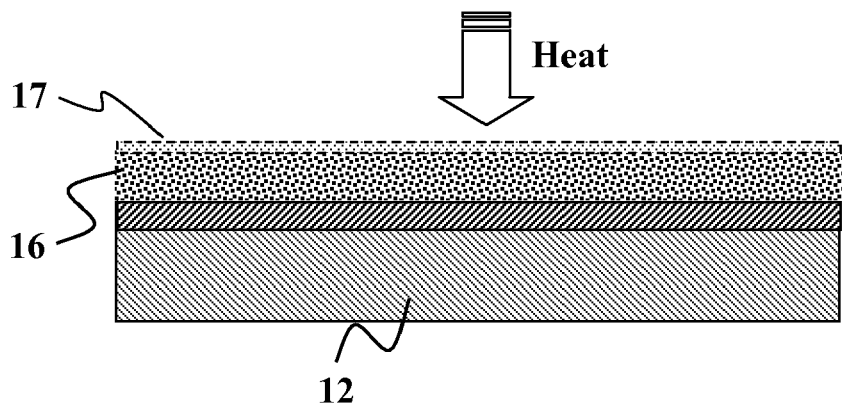

Referring now to FIG. 1C, the precursor layer 16 may then be processed in a suitable atmosphere to form a film. The film may be a dense film. In one embodiment, this involves heating the precursor layer 16 to a temperature sufficient to convert the ink (as-deposited). Note that solvent and possibly dispersant have been removed by drying. The temperature may be between about 375° C. and about 525° C. (a safe temperature range for processing on aluminum foil or high-temperature polymer substrates). The processing may occur at various temperatures in the range, such as but not limited to 450° C. In other embodiments, the temperature at the substrate may be between about 400° C. and about 600° C. at the level of the precursor layer, but cooler at the substrate. The time duration of the processing may also be reduced by at least about 20% if certain steps are removed. The heating may occur over a range between about a fraction of a second to about twenty minutes. In one embodiment, the processing comprises heating the precursor layer to a temperature greater than about 375° C. but less than a melting temperature of the substrate for a period of less than about 15 minutes. In another embodiment, the processing comprises heating the precursor layer to a temperature greater than about 375° C. but less than a melting temperature of the substrate for a period of 1 minute or less. In a still further embodiment, the processing comprises heating the precursor layer to an annealing temperature but less than a melting temperature of the substrate for a period of about 1 minute or less. The processing step may also be accelerated via thermal processing techniques using at least one of the following processes: pulsed thermal processing, which in a non-limiting example is carried out by exposure to laser beams and/or heating via IR lamps, and/or similar or related processes. Pulsed processing using for example a laser beam requires about a fraction of a second for thermal processing.

Figure 1D:
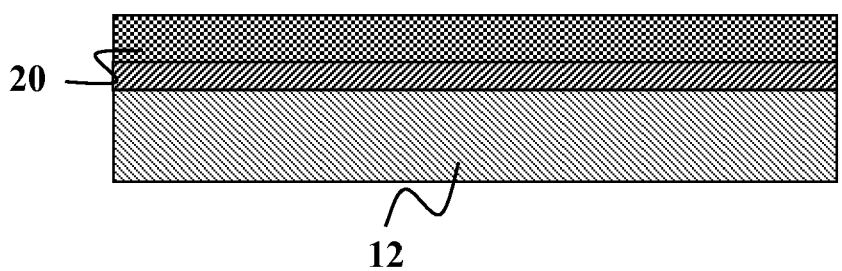

Referring now to FIG. 1D, the precursor layer 16 is processed to form the dense film 20. The dense film 20 may actually have a reduced thickness than the thickness of the wet precursor layer 16 since the carrier liquid and other materials have been removed during processing. In one embodiment, the film 20 may have a thickness in the range of about 0.1 microns to about 3.0 microns. In other embodiments, the thickness of film 20 may be between about 1.0 microns and about 2.25 microns. In one embodiment, the resulting dense film 20 may be substantially void free. In some embodiments, the dense film 20 has a void volume of about 5% or less. In other embodiments, the void volume is about 10% or less. In another embodiment, the void, volume is about 20% or less. In still other embodiments, the void volume is about 24% or less. In still other embodiments, the void volume is about 30% or less. The total volume may be the space between the particles of the solution coated film (interstitial volume) plus the volume within the particles (particle volume).

Figure 1E:
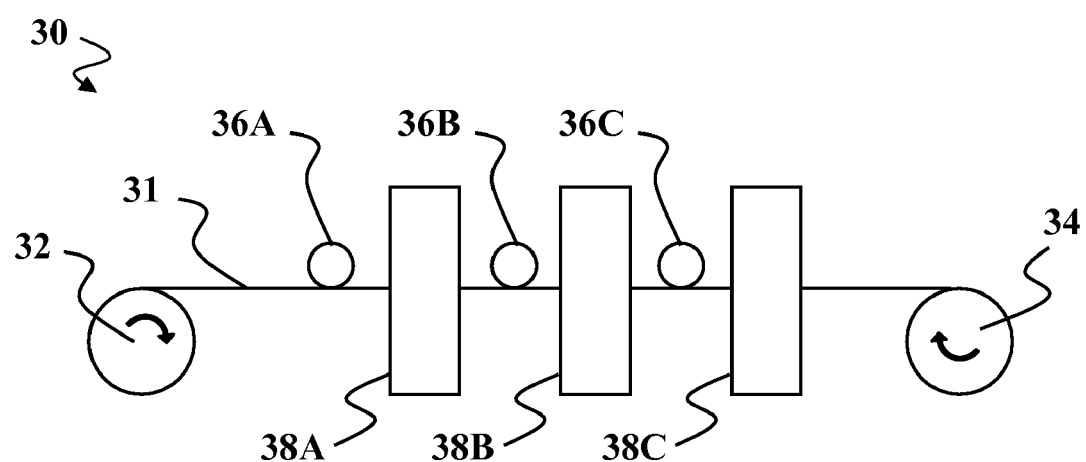
FIG. 1E shows a roll-to-roll manufacturing assembly according to an embodiment of the present invention.

Referring now to FIG. 1E, embodiments of the invention may be compatible with roll-to-roll manufacturing. Specifically, in a roll-to-roll manufacturing system 30 a flexible substrate 31, e.g., aluminum or other metal or metallized foil travels from a supply roll 32 to a take-up roll 34. In between the supply and take-up rolls, the substrate 31 passes a number of applicators 36A, 36B, 36C, e.g. microgravure rollers and heater units 38A, 38B, 38C. Each applicator deposits a different layer or sub-layer of a photovoltaic device active layer, e.g., as described above. The heater units are used to anneal the different sub-layers. In the example depicted in FIG. 14, applicators 36A and 36B may be applied different sub-layers of a precursor layer. Heater units 38A and 38B may anneal each sub-layer before the next sub-layer is deposited. Alternatively, both sub-layers may be annealed at the same time. Applicator 36C may apply a layer of material containing chalcogen particles as described above. Heater unit 38C heats the chalcogen layer and precursor layer as described above. Note that it is also possible to deposit the precursor layer (or sub-layers) then deposit the chalcogen-containing layer and then heat all three layers together to form the IB-IIIA-chalcogenide compound film used for the photovoltaic absorber layer.

Cell Configuration

Figure 2A:
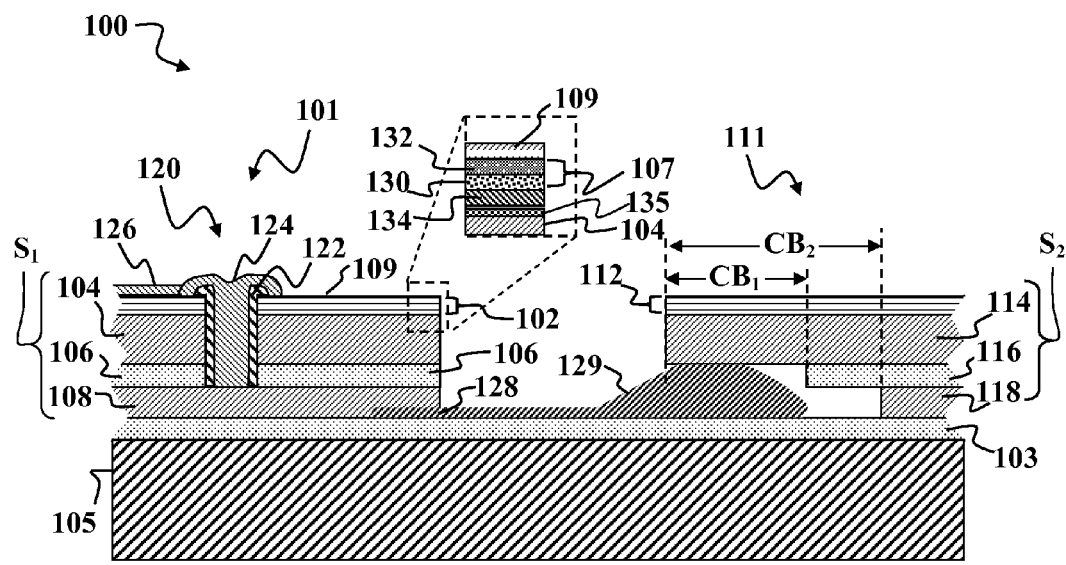
FIGS. 2A and 2B show cross-sectional and top-down views of one embodiment of photovoltaic cells according to an embodiment of the present invention.
Figure 2B:
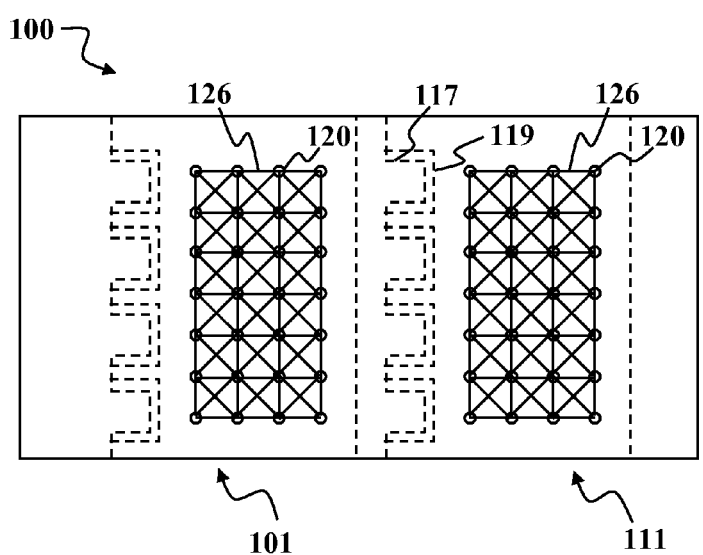

FIGS. 2A-2B illustrates an array 100 of optoelectronic devices according to an embodiment of the present invention. In some embodiments, this may be considered a series interconnection in an array 100 of optoelectronic devices. The array 100 includes a first device module 101 and a second device module 111. The device modules 101, 111 may be photovoltaic devices, such as solar cells, or light-emitting devices, such as light-emitting diodes. In a preferred embodiment, the device modules 101, 111 are solar cells. The first and second device modules 101, 111 are attached to an insulating carrier substrate 103, which may be made of a plastic material such as polyethylene terephthalate (PET), e.g., about 50 microns thick. The carrier substrate 103 may, in turn, be attached to a thicker structural membrane 105, e.g., made of a polymeric roofing membrane material such as thermoplastic polyolefin (TPO) or ethylene propylene diene monomer (EPDM), to facilitate installing the array 100 on an outdoor location such as a roof.

The device modules 101, 111, which may be about 150 mm in length and about 75 mm wide, may be cut from a much longer sheet containing several layers that are laminated together. Each device module 101, 111 generally includes a device layer 102, 112 in contact with a bottom electrode 104, 114 and an insulating layer 106, 116 between the bottom electrode 104, 114 and a conductive back plane 108, 118. It should be understood that in some embodiments of the present invention, the back plane 108, 118 may be described as a backside top electrode 108, 118. The bottom electrodes 104, 114, insulating layers 106, 116 and back planes 108, 118 for substrates $S_1$, $S_2$ on which the device layers 102, 112 are formed.

In contrast to prior art cells, where the substrates are formed by depositing thin metal layers on an insulating substrate, embodiments of the present invention utilize substrates $S_1$, $S_2$ based on flexible bulk conducting materials, such as foils. Preferably, at least the bottom electrode 104, 114 is made of a metal foil, such as aluminum foil. Alternatively, copper, stainless steel, titanium, molybdenum or other suitable metal foils, or metallized plastic foils may be used, either singly or in combination. By way of non-limiting example, the bottom electrodes 104, 114 and back planes 108, 118 may be made of aluminum foil about 1 micron to about 200 microns thick, preferably about 25 microns to about 100 microns thick; the insulating layers 106, 116 may be made of a plastic foil material, such as polyethylene terephthalate (PET) about 1 micron to about 200 microns thick, preferably about 10 microns to about 50 microns thick. In one embodiment, among others, the bottom electrode 104,114, insulating layer 106, 116 and back plane 108, 118 are laminated together to form the starting substrates $S_1$, $S_2$. Although foils may be used for both the bottom electrode 104, 114 and the back plane 108, 118 it is also possible to use a mesh grid on the back of the insulating layer 106, 116 as a back plane. Such a grid may be printed onto the back of the insulating layer 106, 116 using a conductive ink or paint where the printed grid is between 1 and 200 micrometers, preferably between 5 and 50 micrometers. One example, among others, of a suitable conductive paint or ink is Dow Corning® PI-2000 Highly Conductive Silver Ink available from Dow Corning Corporation of Midland Mich. Dow Corning® is a registered trademark of Dow Corning Corporation of Midland Mich. Furthermore, the insulating layer 106, 116 may be formed by anodizing a surface of a foil used for the bottom electrode 104, 114 or back plane 108, 118 or both, or by applying an insulating coating by spraying, coating, or printing techniques known in the art.

The device layers 102, 112 generally include an active layer 107 disposed between a transparent conductive layer 109 and the bottom electrode 104. By way of example, the device layers 102, 112 may be about 2 microns thick. At least the first device 101 includes one or more electrical contacts 120 between the transparent conducting layer 109 and the back plane 108. The electrical contacts 120 are formed through the transparent conducting layer 109, the active layer 107, the bottom electrode 104 and the insulating layer 106. The electrical contacts 120 provide an electrically conductive path between the transparent conducting layer 109 and the back plane 108. The electrical contacts 120 are electrically isolated from the active layer 107, the bottom electrode 104 and the insulating layer 106.

The contacts 120 may each include a via formed through the active layer 107, the transparent conducting layer 109, the bottom electrode 104 and the insulating layer 106. Each via may be about 0.1 millimeters to about 1.5 millimeters, preferably 0.5 millimeters to about 1 millimeter in diameter. The vias may be formed by punching or by drilling, for example by mechanical, laser or electron beam drilling, or by a combination of these techniques. An insulating material 122 coats sidewalls of the via such that a channel is formed through the insulating material 122 to the back plane 108. The insulating material 122 may have a thickness between about 1 micron and about 200 microns, preferably between about 10 microns and about 200 microns.

The insulating material 122 should preferably be at least about 10 microns thick to ensure complete coverage of the exposed conductive surfaces behind it. The insulating material 122 may be formed by a variety of printing techniques, including for example inkjet printing or dispensing through an annular nozzle. A plug 124 made of an electrically conductive material at least partially fills the channel and makes electrical contact between the transparent conducting layer 109 and the back plane 108. The electrically conductive material may similarly be printed. A suitable material and method, for example, is inkjet printing of solder (called "solderjet" by Microfab, Inc., Plano, Tex., which sells equipment useful for this purpose). Printing of conductive adhesive materials known in the art for electronics packaging may also be used, provided time is allowed subsequently for solvent removal and curing. The plug 124 may have a diameter between about 5 microns and about 500 microns, preferably between about 25 and about 100 microns.

By way of nonlimiting example, in other embodiments, the device layers 102, 112 may be about 2 microns thick, the bottom electrodes 104, 114 may be made of aluminum foil about 100 microns thick; the insulating layers 106, 116 may be made of a plastic material, such as polyethylene terephthalate (PET) about 25 microns thick; and the backside top electrodes 108, 118 may be made of aluminum foil about 25 microns thick. The device layers 102, 112 may include an active layer 107 disposed between a transparent conductive layer 109 and the bottom electrode 104. In such an embodiment, at least the first device 101 includes one or more electrical contacts 120 between the transparent conducting layer 109 and the backside top electrode 108. The electrical contacts 120 are formed through the transparent conducting layer 109, the active layer 107, the bottom electrode 104 and the insulating layer 106. The electrical contacts 120 provide an electrically conductive path between the transparent conducting layer 109 and the backside top electrode 108. The electrical contacts 120 are electrically isolated from the active layer 107, the bottom electrode 104 and the insulating layer 106.

In forming the vias, it is important to avoid making shorting connections between the top electrode 109 and the bottom electrode 104. Therefore, mechanical cutting techniques such as drilling or punching may be advantageously supplemented by laser ablative removal of a small volume of material near the lip of the via, a few microns deep and a few microns wide. Alternatively, a chemical etching process may be used to remove the transparent conductor over a diameter slightly greater than the via. The etching can be localized, e.g., by printing drops of etchant in the appropriate places using inkjet printing or stencil printing or by masking and etching with liquid, gaseous, or ionized-gas etchant.

A further method for avoiding shorts involves deposition of a thin layer of insulating material on top of the active layer 107 prior to deposition of the transparent conducting layer 109. This insulating layer is preferably several microns thick, and may be in the range of 1 to 100 microns. Since it is deposited only over the area where a via is to be formed (and slightly beyond the borders of the via), its presence does not interfere with the operation of the optoelectronic device. In some embodiments of the present invention, the layer may be similar to structures described in U.S. patent application Ser. No. 10/810,072 to Karl Pichler, filed Mar. 25, 2004, which is hereby incorporated by reference. When a hole is drilled or punched through this structure, there is a layer of insulator between the transparent conducting layer 109 and the bottom electrode 104 which may be relatively thick compared to these layers and to the precision of mechanical cutting processes, so that no short can occur.

One or more conductive traces 126, e.g., made of Al, Ni, or Ag, may be disposed on the transparent conducting layer 109 in electrical contact with the electrically conductive material 124. As shown in FIG. 2B, the traces 126 may interconnect multiple contacts 120 to reduce the overall sheet resistance. By way of example, the contacts 120 may be spaced about 1 centimeter apart from one another with the traces 126 connecting each contact with its nearest neighbor or in some cases to the transparent conductor surrounding it. Preferably, the number, width and spacing of the traces 126 is chosen such that the contacts 120 and traces 126 cover less than about 1% of the surface of the device module 101. The traces 126 may have a width between about 1 micron and about 200 microns, preferably between about 5 microns and about 50 microns. The traces 126 may be separated by center-to-center distances between about 0.1 millimeter and about 10 millimeters, preferably between about 0.5 millimeter and about 2 millimeters. Wider lines require a larger separation in order to avoid excessive shadowing loss. A variety of patterns or orientations for the traces 126 may be used so long as the lines are approximately equidistant from each other (e.g., to within a factor of two). Note that since the conductive back planes 108, 118 carry electrical current from one device module to the next the conductive traces 126 can include "fingers" while avoiding thick "busses". This reduces the amount of shadowing due to the busses and also provides a more aesthetically pleasing appearance to the device array 100.

Fabricating the device modules 101, 111 on substrates $S_1$, $S_2$ made of relatively thick, highly conductive, flexible bulk conductor bottom electrodes 104, 114 and backplanes 108, 118 and forming insulated electrical contracts 120 through the transparent conducting layer 109, the active layer 130, the bottom electrodes 104, 114 and the insulating layer 106, 116 allows the device modules 101, 111 to be relatively large. Consequently the array 100 can be made of fewer device modules requiring fewer series interconnections compared to prior art arrays. For example, the device modules 101, 111 may be between about 1 centimeter and about 30 centimeters long and between about 1 and about 30 centimeters wide. Smaller cells (e.g., less than 1 centimeter long and/or 1 centimeter wide) may also be made as desired.

Note that since the back planes 108, 118 carry electric current from one device module to the next, the pattern of traces 126 need not contain thick busses, as used in the prior art for this purpose. Instead, the pattern of traces 126 need only provide sufficiently conductive "fingers" to carry current to the contacts 120. In the absence of busses, a greater portion of the active layers 102, 112 is exposed, which enhances efficiency. In addition, a pattern of traces 126 without busses can be more aesthetically pleasing.

Electrical contact between the back plane 108 of the first device module 101 and the bottom electrode 114 of the second device module 111 may be implemented by cutting back the back plane 118 and insulating layer 116 of the second device module to expose a portion of the bottom electrode 114. FIG. 1B illustrates an example of one way, among others, for cutting back the back plane 118 and insulating layer 116. Specifically, notches 117 may be formed in an edge of the insulating layer 116. The notches 117 align with similar, but slightly larger notches 119 in the back plane 118. The alignment of the notches 117, 119 exposes portions of the bottom electrode 114 of the second device module 111.

The first device module 101 may be attached to the carrier substrate 103 such that the back plane 108 makes electrical contact with the thin conducting layer 128 while leaving a portion of the thin conducting layer 128 exposed. Electrical contact may then be made between the exposed portion of the thin conducting layer 128 and the exposed portion of the bottom electrode 114 of the second device module 111. For example, a bump of conductive material 129 (e.g., more conductive adhesive) may be placed on the thin conducting layer 128 at a location aligned with the exposed portion of the bottom electrode 114. The bump of conductive material 129 is sufficiently tall as to make contact with the exposed portion of the bottom electrode 114 when the second device module 111 is attached to the carrier substrate. The dimensions of the notches 117, 119 may be chosen so that there is essentially no possibility that the thin conducting layer 128 will make undesired contact with the back plane 118 of the second device module 111. For example, the edge of the bottom electrode 114 may be cut back with respect to the insulating layer 116 by an amount of cutback $CB_1$ of about 400 microns. The back plane 118 may be cut back with respect to the insulating layer 116 by an amount $CB_2$ that is significantly larger than $CB_1$.

The device layers 102, 112 are preferably of a type that can be manufactured on a large scale, e.g., in a roll-to-roll processing system. There are a large number of different types of device architectures that may be used in the device layers 102, 112. By way of example, and without loss of generality, the inset in FIG. 2A shows the structure of a CIGS active layer 107 and associated layers in the device layer 102. By way of example, the active layer 107 may include an absorber layer 130 based on materials containing elements of groups IB, IIIA and VIA. Preferably, the absorber layer 130 includes copper (Cu) as the group IB, Gallium (Ga) and/or Indium (In) and/or Aluminum as group IIIA elements and Selenium (Se) and/or Sulfur (S) as group VIA elements. Examples of such materials (sometimes referred to as CIGS materials) are described in U.S. Pat. No. 6,268,014, issued to Eberspacher et al on Jul. 31, 2001, and US Patent Application Publication No. US 2004-0219730 A1 to Bulent Basol, published Nov. 4, 2004, both of which are incorporated herein by reference. A window layer 132 is typically used as a junction partner between the absorber layer 130 and the transparent conducting layer 109. By way of example, the window layer 132 may include cadmium sulfide (CdS), zinc sulfide (ZnS), or zinc selenide (ZnSe) or some combination of two or more of these. Layers of these materials may be deposited, e.g., by chemical bath deposition or chemical surface deposition, to a thickness of about 50 nm to about 100 nm. A contact layer 134 of a metal different from the bottom electrode may be disposed between the bottom electrode 104 and the absorber layer 130 to inhibit diffusion of metal from the bottom electrode 104. For example, if the bottom electrode 104 is made of aluminum, the contact layer 134 may be a layer of molybdenum. An optional barrier layer 135 may be used between the contact layer 134 and the absorber layer 130. The layer 135 may be a diffusion barrier layer that prevents aluminum or other material from bottom electrode 104 from migrating upward to contaminate the absorber layer 130 while the layer 135 remains electrically conductive. The layer 135 may be electrically conductive versions of chromium, vanadium, tungsten, nitrides, tantalum nitride, tungsten nitride, titanium nitride, silicon nitride, oxides, or carbides.

Roofing Membrane

Figure 3:
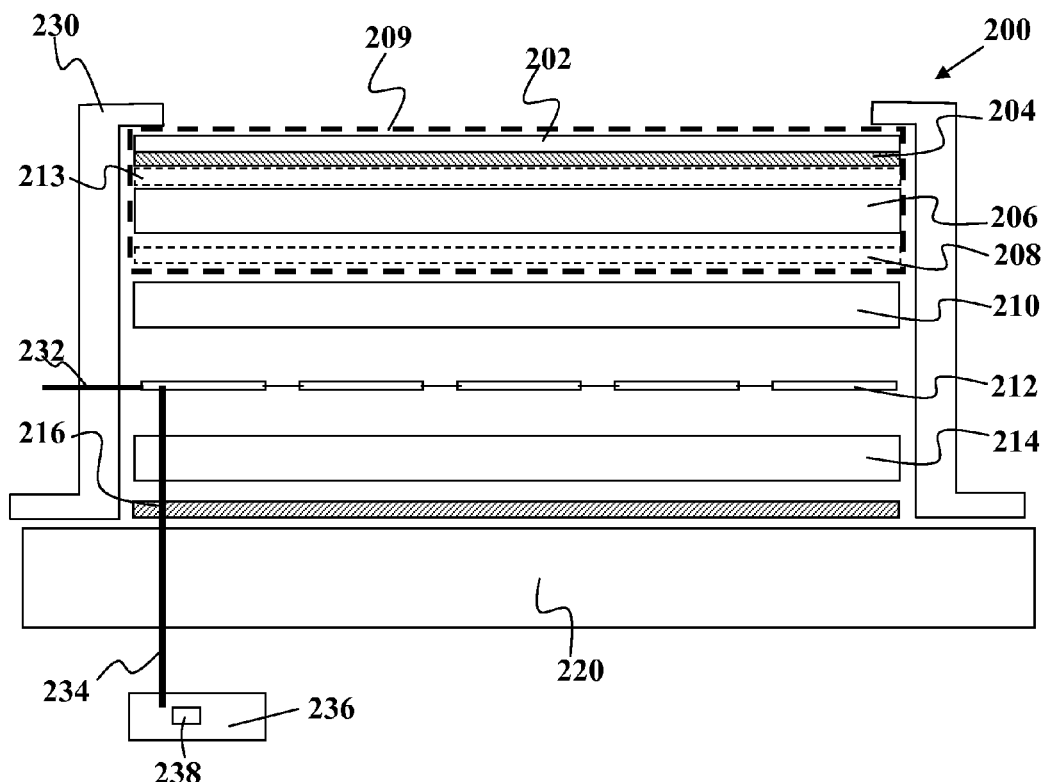
FIG. 3 shows an exploded cross-sectional view of a photovoltaic roofing membrane according to an embodiment of the present invention.

Referring now to FIG. 3, one embodiment of a roofing assembly 200 using a thin-film photovoltaic cell will now be described. For ease of illustration, an exploded view is provided to more clearly show the various elements. This embodiment of the present invention includes a plurality of layers laminated or otherwise formed with the photovoltaic cells over the roofing membrane. Lamination is the general process of bonding stacks of thin layers. An alternative process related to but different from pure lamination is to generate the bonded stacks of thin layers by forming one or more layers within the bonding process. For examples, a layer can be formed in situ by depositing a (curable or hardenable) liquid containing hard spacer particles within the stack of layers, pressing the stack to deform the liquid until most or all hard spacer particles simultaneously touch the layer above and the layer below. This in situ layer can then be cured or hardened to convert the liquid to a solid layer. The curing or hardening process might be activated by heat, passage of time, cooling from a hot state, UV light, visible light, electron beam irradiation, gamma irradiation, oxygen, anaerobic conditions, moisture, or combinations thereof. Specifically, as seen in FIG. 3, the roofing assembly 200 includes a scratch resistant layer 202 with a coupling layer 204. A top layer 206 may be coupled to the scratch resistant layer 202. An optional moisture resistant barrier layer 208 may also be included. It should be understood of course, that all of the above may optionally be replaced in some embodiments by a single layer 209 (as shown in phantom) which may include some or all of the functional abilities of the other layers. An encapsulant film 210 is included above the plurality of photovoltaic cells 212. Although not limited to the following, the encapsulant film 210 may be ethylene vinyl acetate (EVA) film, such as sold by Specialized Technical Resources (STR) of Enfield, Conn. or thermoplastic polyurethane (TPU) film, such as sold by Etimex of Dietenheim, Germany. The encapsulant film may be between 10 micrometers and 1000 micrometers, preferably 50 micrometers to 500 micrometers. The TPU may be aliphatic type for UV resistance and/or ether type for moisture resistance. The encapsulant film 210 is selected for its ability to melt and surround the cells 212.

Referring still to FIG. 3, the photovoltaic cells 212 are preferably flexible cells. Although not limited to the following, they may be thin-film cells with a copper alloy absorber layer formed on metal foil, metal covered polymer, or other flexible substrates as previously discussed. The cells are flexible in the sense that they may deflect between about 1 mm to about 1000 mm radius of curvature, preferably 5 mm to 500 mm, most preferably 10 mm to 100 mm, without damaging the cell. In the embodiment of FIG. 3, another encapsulant film 214 may be positioned beneath the photovoltaic cells 212. An adhesive layer 216 may be located beneath the encapsulant film 214 to adhere the layer 214 to the roofing membrane 220. The adhesive layer may be between 10 and 5000 microns thick, preferably between 50 and 2000 microns.

In one embodiment of the roofing assembly 200, the top layer 206 may be ethylene-tetrafluoroethylene (ETFE) copolymer such as but not limited to Tefzel® ETFE of about 50 micron thickness. In other embodiments, the thickness may be in the range of about 10 to 300 microns. The layer 208 coupled to the layer 206 may be a silica (SiOx) or alumina (ALOx) thin film barrier layer (10 nm to 1000 nm) or a thick film of Aclar® chlorotrifluorethylene (CTFE) (1 to 100 microns, preferably 2 to 50 microns). For greater scratch resistance, a silicone hardcoat available from General Electric of Schenectady, N.Y. provides a UV-curable, transparent highly weatherproof hardcoat and may be used alone on a printable grade of ETFE film or in conjunction with a coupling agent on a general purpose grade of ETFE film. An example ETFE silicone coupling agent is a fluorosilane type of coupling agent. Alternatively or in combination, a thin barrier film can be formed on the device by use of the deposition of a silicon alloy material via the penning discharge plasma source technique developed by General Plamsa, Inc. (Tuscon, Az). To further weatherproof the laminated assembly, a perimeter sealant 230 may be provided along the periphery of the roofing assembly 200. The perimeter sealant 230 may be solar edge tape (from TruSeal Technologies of Barbourville, Ky.), rubber sealant (solvent based or water based), natural rubber, Viton® rubber, neoprene rubber, silicone sealant, polyurethane sealant, acrylic sealant, Neoprene® (poly chloroprene) sealant, hot-melt sealant (typically various thermoplastic polyolefins), thermoplastic elastomers (TPEs), EVA sealants, or combinations thereof. The aforementioned may also be used as part of adhesive layers 204 or 216. The sealant may also be protected and enhanced by affixing a weatherproof layer such as but not limited to a strip of roofing membrane material (PVC, TPO, EPDM).

As seen in FIG. 3, electrical leads 232 or 234 may extend outward from the perimeter sealant 230 or the roofing membrane 220. The leads may be coupled to other photovoltaic cells. Alternatively, they may be coupled to a junction box 236. The junction box 236 may include one or more bypass diodes 238. Other embodiments may have one or more bypass diodes 238 embedded in the flexible laminate or in a small protective enclosure optionally potted within the enclosure with silicone or other pottant. The bypass diodes provide a means to bypass regions of solar cells that are not illuminated by the sun or are no longer capable of converting sunlight to electricity due to damage of some kind. The electrical connections are arranged so that PV cells are in series strings. The strings are arranged in either series or parallel electrical connections so as to design in a target combination of voltage and electrical current for a given electrical power output capability. In the presence of bypass diodes, partial blockage of the sun or partial damage to a solar cell or module substantially reduces the impact of that partial blockage or damage that would otherwise reduce the power output arising from said string. In particular, if one module in a series string fails, it produces so much resistance that the other modules in said string are cut off and no longer can contribute to the power output for the solar system. A bypass diode creates an electrical path around the disabled module. Further, solar panels can be assembled in two or more strings within one frame, with each string within the panel having its own bypass diode. These can deteriorate or fail if the panels are installed incorrectly, are struck by lightning, or from electrical overload. Furthermore, an additional class of diode, termed a blocking diode, is optionally used in solar systems with no charge controller to prevent power from feeding back to the solar panel if batteries are employed in the solar system.

Although not limited to the following, the roofing membrane 220 may be a single ply membrane or a multi-ply membrane. The membrane 220 may be made from a variety of materials including modified bitumens such as composite sheets consisting of bitumen, modifiers (APP, SBS) and/or reinforcement such as plastic film, polyester mats, fiberglass, felt, yarns, or textiles. Textiles are classified according to their component fibers into silk, wool, linen, cotton, such synthetic fibers as rayon, nylon, and polyesters, and some inorganic fibers, such as cloth of gold, glass fiber, and asbestos cloth. They are also classified as to their structure or weave, according to the manner in which warp and weft cross each other in the loom. Examples of fibers include but are not limited to metallic or metallized yarns, conductive polymers coated fibers (e.g. for textile electronic and/or photonic applications), woven polymers, including mylon, mylar (PET), and extruded plastics. Fibers can be made from naturally occurring materials such as flax, cotton, wool, silk, and/or from man-made materials such rayon, acetate, nylon, acrylic, polyester, tri-acetate, spandex, Kevlar®, Gore-Tex®, polyolefin, polypropylene, microfibers, micodenier, lycocel, lycocil, and/or combinations, blends, or mixtures of these and related or similar materials.

Optionally, the membrane 220 may be a thermoplastic (poly-vinylchloride (PVC). The PVC membrane may be single-ply, double-ply, triple-ply, or multiple-ply, depending upon the configuration requirements for a particular installation site. The PVC membrane may be reinforced or non-reinforced. In an ethylene interpolymer, such as non-vulcanized elastomers, there is no cross-linking of the molecules. Optionally, the membrane 220 may be a vulcanized elastomers (e.g. EPDM, Neoprene) where the chemical cross linkage of polymers (chains of molecules) occurs during the manufacturing process. Still further, the membrane 220 may be a non-vulcanized elastomer such as but not limited to chlorinated polyethylene, chlorosulfonated polyethylene, polyisobutylene, or acrylonitrile butadiene polymer.

Mixtures of man-made and/or synthetic fibers combined with other (e.g. thermoplastic) materials can also be used. In a non-limiting example, PVC could be coated onto a synthetic and/or naturally arising fiber and woven into a thermoplastic-coated membrane.

The resulting roofing assembly 200 with the membrane 220 and the photovoltaic cells 212 is a multi-functional device providing both roofing coverage for the building and energy generating capability. The specific power associated with the thin-film photovoltaic cells 212 of the present invention along with packaging improvements provide performance not seen to date. The reduction in weight of the photovoltaic cell provides significant advantages. For example, in one nonlimiting embodiment, using a thin film absorber layer instead of a silicon based absorber layer reduces weight by about 17× (300 g for Si versus 18 g for thin film). Reduction in weight of the encapsulant and mounting substrate of the photovoltaic also significantly improves performance. Table I shows the weight for one nonlimiting example of a rigid conventional packaging versus flexible improved packaging of the present invention. Both are assumed to have a 143 watt total output. Clearly the specific power of the flexible cells are much better than those of the rigid packaged cell. Higher specific power density per unit weight leads to the ability to install these membranes on more types of roofs that in the past may not have been able to support the added weight of a photovoltaic roofing assembly. Thus, a larger range of rooftops become suitable for these types of energy generating roofing membranes.

TABLE I

| Component | Conventional (13% efficiency) | Improved (13% efficiency) |
| --- | --- | --- |
| Photoactive Layer: | 18 g | 18 g |
| Electrodes | 460 g | 460 g |
| Encapsulant | 8,500 g | 150 g |
| Mounting Substrate | 2,420 g | 470-700 g |
| Total Weight: | 11,398 g | 1098-1328 g |
| Specific Power | 12.5 w/kg | 107.7-130.2 w/kg |

It should be understood that some embodiments further improve upon the results in Table I by using thinner sheets of the mounting substrate or by eliminating it all together. Eliminating the substrate altogether allows for a specific power as high as 439 W/kg. Of course, other embodiments may use thicker mounting substrates and decrease the specific power. As a nonlimiting example, some embodiments may a specific power in the range of about 50 W/kg.

Figure 4:
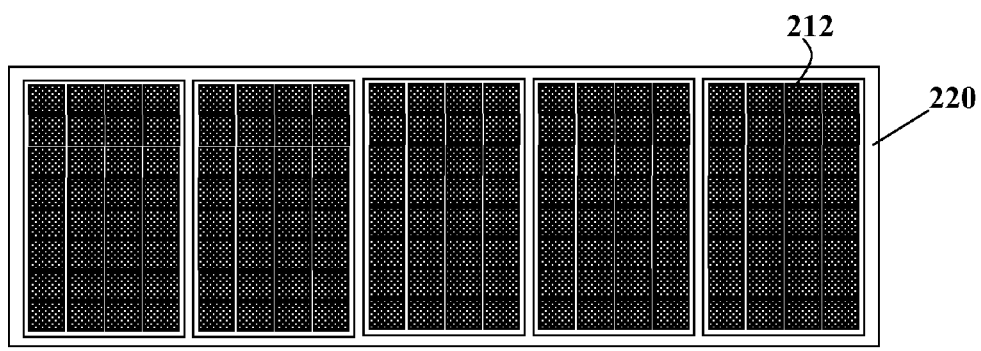
FIG. 4 shows a top-down view of an assembly according to an embodiment of the present invention.

Referring now to FIG. 4, the present invention may also provide improvement in specific power per unit area. FIG. 4 is a top down view showing photovoltaic cells 212 mounted on the roofing membrane 220. Because the thin-film solar cells of the present invention are of efficiencies greater than those of traditional thin-film solar cells, the present invention can also provide a higher power density per unit area. Furthermore, the present invention also improves upon the efficiency of flexible silicon based cells. Traditional efficiency for amorphous silicon (a-Si) cells in SIT products from Unisolar is in the range of about 4-5%. The present invention provides cells with higher conversion efficiencies, typically in the range of about 10-15%. This increased efficiency along with other factors such as using foils of reduced weight such as but not limited to aluminum allows for a significant improvement in specific power.

Figure 5:
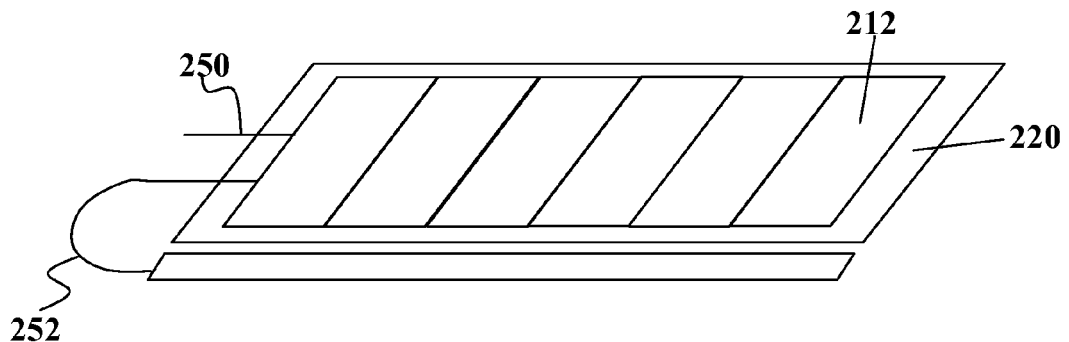
FIG. 5 shows a view of another assembly according to an embodiment of the present invention.

Referring now to FIG. 5, a side view is shown of a roofing assembly 220 with photovoltaic cells 212 mounted on the membrane. The string of the photovoltaic cells 212 may be terminated by leads 250 and 252 which extend outward from roofing membrane 220. Conventionally, strings are a 1 by N series of cells, where N is between 2 and 20, preferably between 4 and 12, and where each cell is substantially square or rectangular with lengths and widths between 50 mm and 500 mm, preferably between 75 mm and 300 mm. The cells are conventionally electrically in series as well. Alternatively, the cells could be electrically in parallel, thus generating high current at low voltage, but with increased ampacity requirements in the conductive circuit. The electrical connections between the cells may be provided by wires, foils, ribbons, and the like, single or plural per connection, similar in dimension to the cell dimensions or significantly smaller than the cell dimensions. In another example, the string could have a monolithic substrate with cells arranged in electrical series or parallel on this substrate. The leads 250 and 252 may be ribbons having width in the range of about 1 mm to half the width of the cell and having thickness in the range of about 10 microns to 250 microns, preferably between 50 and 150 microns. One or both of the leads 250 may extend through pipe or elongate member 254 for routing between membranes. The pipe is conventionally called electrical conduit. The pipe is preferably tough, sunlight resistant, and weather resistant to protect the leads within. Conventionally the pipe is either metal or a UV-resistant grade of plastic, or a metallized plastic material.

Figure 6:
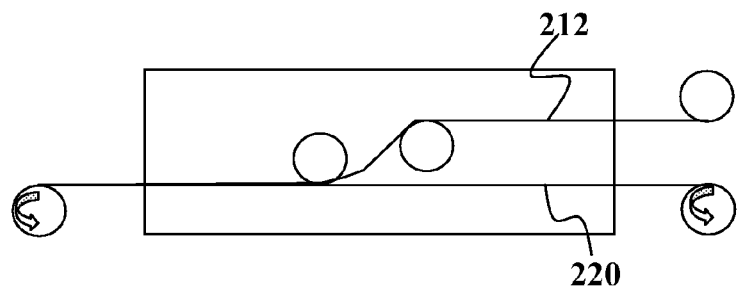
FIG. 6 shows another roll-to-roll process according to an embodiment of the present invention.

Referring now to FIG. 6, it should be understood that the present invention may also be well suited for assembly via a variety of processes including, but not limited to, a roll-to-roll process. As discussed previously in regards to FIG. 1E, the photovoltaic cells 212 themselves may be manufactured using a roll-to-roll process. The cells 212 may be processed and assembled in strings of cells 212. Then, the assembly of a string of cells 212 and the roofing membrane 220 may also be combined together using a roll-to-roll assembly process where rollers may be used to bring the two together as seen in FIG. 6. A roll of roofing membrane 220 may be unrolled and brought together with one or more strings of photovoltaic cells 212. Subsequently, the combined multi-layer assembly 200 may enter a laminator to complete the assembly process. As a nonlimiting example, one method of lamination for an EVA encapsulant for use with the roofing assembly is vacuum lamination at about 135° C., 1 atm pressure, for 10 to 30 minutes, in a thermoset process. In a roll-to-roll process, the vacuum laminator is a long piece of capital equipment that has continuous or step and repeat motion within to both match the production line rate and the time required for EVA lamination. One mode of lamination for TPU encapsulant is hot nip lamination, where the high pressure and temperature rolls quickly laminate the layers together. The heating is to bring the TPU to a hot, soft state for bonding and post-nip cooling is to harden the encapsulant. This thermoplastic process is much faster than the EVA thermoset, on the order of about 10× faster. The capital equipment for roll-to-roll nip lamination is far smaller, simpler, and less costly than roll-to-roll thermoset vacuum lamination. This offsets the higher materials cost of the TPU versus EVA. The lamination process can also include the simultaneous formation of cell-to-cell and cell-to-wiring electrical connections. In this example, cells could be placed on an adjacent layer by a pick-and-place mechanism included in the roll-to-roll process. Other types of lamination suitable for use with the present invention include flatbed roll-to-roll lamination (as provided by Glenro of Paterson N.J.), press lamination, vacuum bag lamination, bath lamination, dip lamination, etc. . . .

Figure 7:
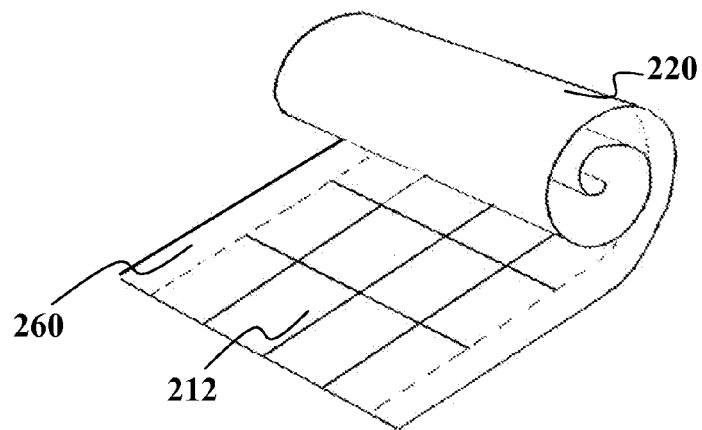
FIG. 7 shows a roll of the photovoltaic assembly according to an embodiment of the present invention.

Referring now to FIG. 7, the resulting roofing membrane 220 and photovoltaic cells 212 may be rolled together and formed in elongated flexible sections of substantially uniform thickness constructed for being rolled up in lengths suitable for being transported to a building site for unrolling and for being affixed to a roof structure. As seen in FIG. 7, the flexible nature of the photovoltaic cells 212 allows them to be rolled up with the roofing membrane 220 without any special mechanical spacers, gaps, or structural alterations found in known devices that use rigid photovoltaic cells. In one embodiment, the rolls are between about 6.5 to about 10 feed wide prefabricated to cover up to the desired area to be covered by one roll. The area may be selected to cover only those areas that receive unobstructed sunlight. In some embodiments, this may be a roll with an area of about 2500 sq ft. In other embodiments, the area may be about 3000 sq ft, 5000 sq ft, 10,000 sq ft, 50,000 sq ft, 100,000 sq ft or more. Optionally, the roofing member 220 includes an area 260 that is not covered by photovoltaic cells 212 to allow for mechanical fastening or adhesion of one roofing membrane to another. Depending on the material used for the roofing membrane, heat gluing, hot-air welding, solvent welding or combinations thereof may be used. Seams may be joined by a variety of other methods including but not limited to plain seam, basted seam, welt seam, flat felled, French, double stitched, serged (three thread serge, four thread serge). These seams may be finished by being pinked, edge stitched, pinked and stitched, zigzagged. Methods to complete a seam include clipping, trimming, grading, and easing, and/or notching. Other possible methods include adhesive bonding with weather-resistant adhesive or adding mechanical reinforcement to the seam by hard fasteners such as rivets. The photovoltaic cells 212 may be spaced apart from the areas that will be heat glued, hot-air welded, and/or otherwise thermally or chemically treated. In some other embodiments, the photovoltaic cells 212 can withstand heat.

As seen in FIG. 7, the rolls formed by the flexible cells and the roofing membrane may have the cells deflecting between about 1 mm to about 1000 mm radius of curvature, preferably about 5 mm to about 500 mm, most preferably 10 mm to 100 mm, without damaging the cell. The ability of the cell to deflect allows the roofing membrane to be applied to the various contours and shapes on the rooftop without being limited by being a roofing membrane. The relative thinness of the photovoltaic cells also allows the rolls to be handled, rolled, unrolled, and transported with substantially the same equipment used to handle typical, non-photovoltaic roofing membranes.

Figure 8:
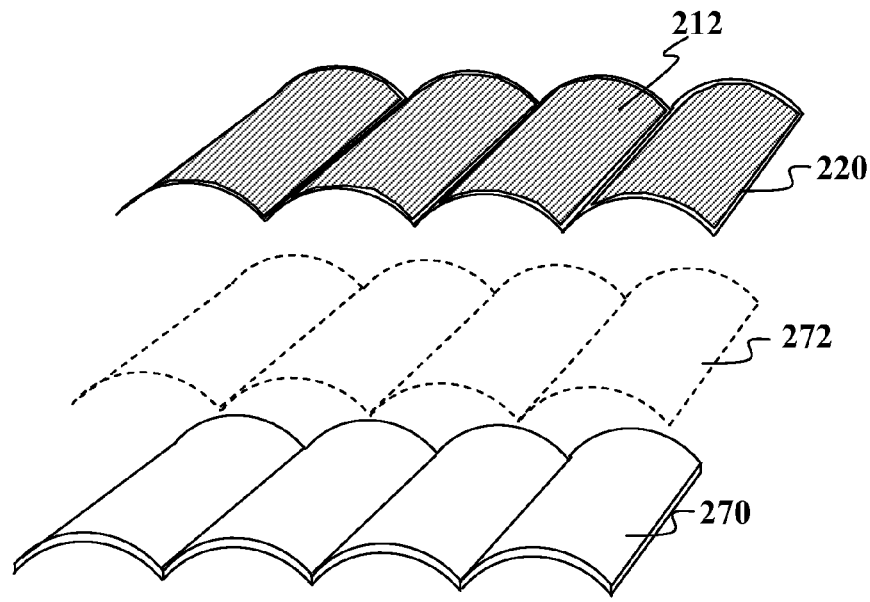
FIG. 8 shows an exploded perspective view of a photovoltaic assembly coupled to a curved support surface according to an embodiment of the present invention.

Referring now to FIG. 8, the membrane 220 and photovoltaic cells 212 may be contoured as desired to follow the shape of the underlying support surface that the membrane 220 is mounted on. In FIG. 8, this may be on curved tiles, flat metal plates, copper roofing member, or any other suitable surface 270. These tiles or plates of surface 270 may be individual, discrete elements or contiguous elements. It should be understood that in some embodiments, the membrane 220 may a less weatherproof membrane and rely on the underlying support surface 270 to provide weatherproofing capability. Optionally, a second layer of material 272 may be attached to the roofing membrane 220. The second layer 272 may be used to provide more structural support or it may be used to improve other qualities of the roofing membrane 220. The second layer 272 may be selected from a variety of materials including but not limited to: photonic textiles, metallic yarns, metallized yarns, conductive polymers on fabrics, textile electronics, woven polymers including mylon, mylar (PET), extruded plastics, stamped metals plates, unstamped metal plates, or combinations thereof. Textiles are classified according to their component fibers into silk, wool, linen, cotton, such synthetic fibers as rayon, nylon, and polyesters, and some inorganic fibers, such as cloth of gold, glass fiber, and asbestos cloth. They are also classified as to their structure or weave, according to the manner in which warp and weft cross each other in the loom (see loom; weaving). Value or quality in textiles depends on several factors, such as the quality of the raw material used and the character of the yarn spun from the fibers, whether clean, smooth, fine, or coarse and whether hard, soft, or medium twisted. Density of weave and finishing processes are also important elements in determining the quality of fabrics. GORE-TEX® expanded polytetrafluoroethylene (PTFE), Kevlar® polyaramid, Nylon® polyamide, Neoprene® polychoroprene, Spandex® elastomer, Velcro® hook and loop fastener, polyvinylchloride, and the like may also be used. Flax, cotton, silk, wool, lyocel, microfibers, microdenier, polyolefin, polypropylene, polyester, triacetate, rayon, acetate, and acrylic may also be used.

It should be understood that for FIG. 8, the curved tiles, flat metal plates, copper roofing member, or any other suitable support surface 270 may be a continuous surface that is stamped, molded, or otherwise formed to appear to be discrete elements (e.g. appear as separate tiles, separate roof shingles, separate roof structures, separate stepped elements, etc. . . . ). The support 270 may be formed as an elongate, continuous substrate that is textured, shaped, and/or treated on a macroscopic scale so that a continuous surface appears to be non-continuous or as discrete elements that are connected. The membrane 220 with the photovoltaic cells 212 may then be covered over a continuous support 270 and this may facilitate the manufacturing of a roofing material that appears as discrete elements but still lends itself for high-throughput manufacturing and/or high-throughput installation.

In addition to being contoured to follow the shape of the underlying roofing support, the roofing membrane 220 and the photovoltaic cells 212 may also be treated to appear pigmented to match the desired color of the roof. The membrane 220 may itself be dyed or pigmented to have the desired color. Optionally, the photovoltaic cells 212 may employ a layer having a notch filter 213 that will pass all wavelengths except those for the color that the cells 212 should appear as. The filter will reflect those wavelengths and observers will see that the cells are of the color being reflected. A camouflage pattern may also be incorporated into the coloring to allow the solar module to be inconspicuous in a natural setting. The camouflage may be designed to match the surrounding environment, be it in a natural environment, an urban environment, or an over-water environment. The location of the notch filter 213 above the cells is variable and may be located at any layer above the cells.

Figure 9:
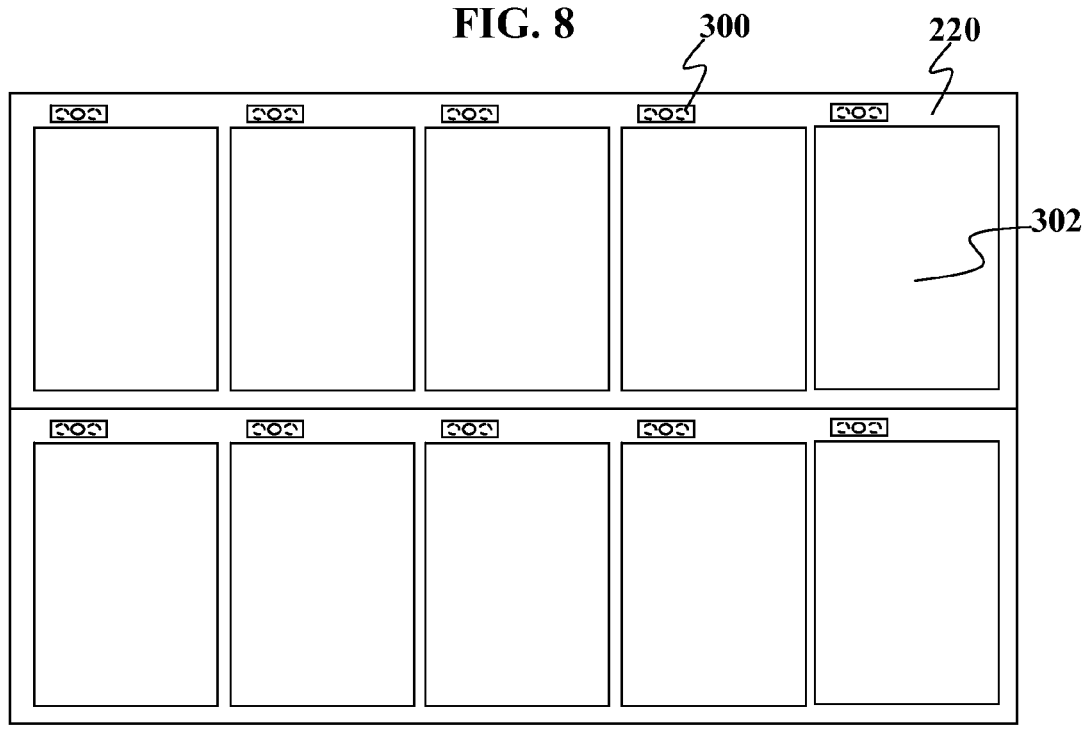
FIG. 9 shows an embodiment of the present invention with a diagnostic device according to an embodiment of the present invention.

Referring now to FIG. 9, embodiments of the present invention may also include a diagnostic device 300 coupled to each replaceable unit 302 of photovoltaic cells to indicate whether or not the photovoltaic cells are malfunctioning or not. In one embodiment, the diagnostic device 300 may include a visual indicator such as but not limited to one or more LEDs which may light up to indicate an malfunction. Malfunction may be determined based on power, voltage, and/or current output above or below a certain desired level. Different colored LEDs may light up depending on the error encountered. This provides for rapid troubleshooting which is desirable when dealing with a roofing assembly with a large number of photovoltaic cells. Too low a power, voltage, and/or current is a more common situation; however, too high a power, voltage, and/or current can damage system components or exceed mandatory limits. This might be due to errors in installation; due to a combination of bright sunlight and record-cold conditions; due to concentration of sunlight onto the PV cells by highly reflective surfaces or refracting lenses, or due to combinations of these and/or other factors.

The roofing membrane is typically installed over a decking material that provides strength and thermal insulation properties. Decking materials often include but are not limited to wood-based sheets such as plywood, particle board, or chip board. Decking materials also include insulation boards such as polyisocyanurate foam boards, polystyrene foam boards, and polyurethane foam boards. In a non-limiting example, the decking material can also be made from a foam-in-place material, such as polyurethane foam. The foam-in-place material is typically shaped to provide a desired roof slope and to provide desired contours for water drainage. The foam-in-place material is also often used to angle the high specific power flexible roofing membrane more perpendicular to the sunlight rays and thus increase to the power output per unit area.

Figure 10:
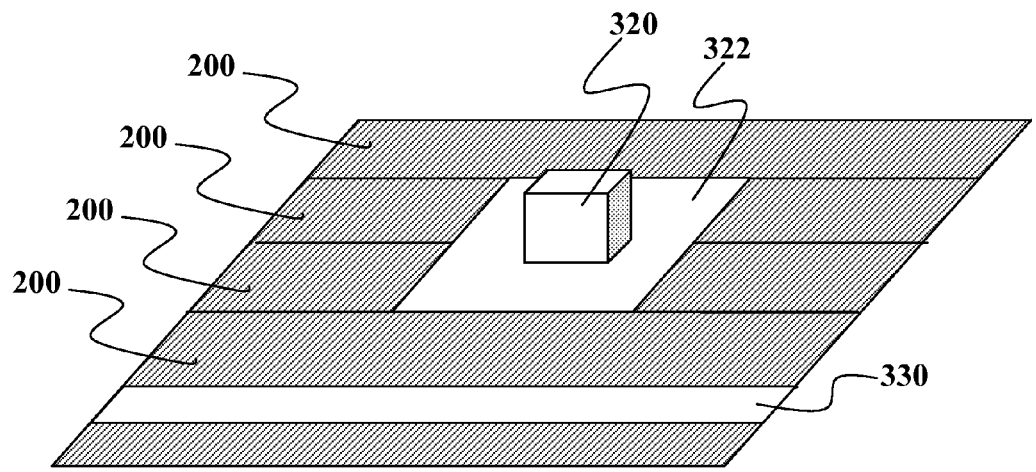
FIG. 10 is a perspective view of a roof covered by a photovoltaic assembly according to an embodiment of the present invention.

Referring now to FIG. 10, a perspective view is shown of a roof area of a building installed with one embodiment of the present invention. FIG. 10 shows a nonlimiting example of an installation of the roofing assembly 200 on a building having a flat roof. The roofing assembly 200 may be laid on the roof in parallel strips as seen in FIG. 10. The typical commercial building may have objects 320 on the rooftop such as HVAC units, electrical equipment, communications equipment, or elevator housings that are obstructions to sunlight exposure. There may also be obstructions not on the rooftop such as nearby buildings, foliage, or antenna towers that may cast significant shadows on the rooftop. Accordingly, there may be areas 322 of the rooftop around an object 320 that does not solar roofing assembly 200 around the object. The rolls of the roofing assembly 200 may be prefabricated to desired lengths and/or shapes that can allow for these areas 322. The area 322 may be selected to be those areas that are shadowed from sunlight by the object 320 at some point during the year. The area 322 may be greater along one side of the object than the other side, depending on the angle and path of the shadow cast by object 320 throughout the year. Hence, the area 322 around object 320 may not be the same around object 320. This minimizes the use of solar roofing assembly 200 in those areas that will not be fully utilized due to shadowing from object 320.

Also seen in FIG. 10, the rolls of the roofing assembly 200 may be configured to be in contact with one another or they may be spaced apart as illustrated by gap 330 in FIG. 10. The gap 330 and the area 322 may be covered by non-energy generating roofing assembly. The gap 330 may allow for a walkway along the rooftop or to provide spacing for pipes or other conduits that may run along the roof top. The gap 330 may also be areas where roofing membranes may be more easily overlapped and joined without risk of damaging photovoltaic material. The layout of the solar roofing assembly 200 may be optimized for performance on a particular rooftop by selective affixing of or selective coverage by the solar membrane system to particular areas of a roof structure at a building site. In some embodiments, the gap 330 may be present between each row of the roofing assembly 200 to allow for easy access to each row of photovoltaic material.

Figure 11:
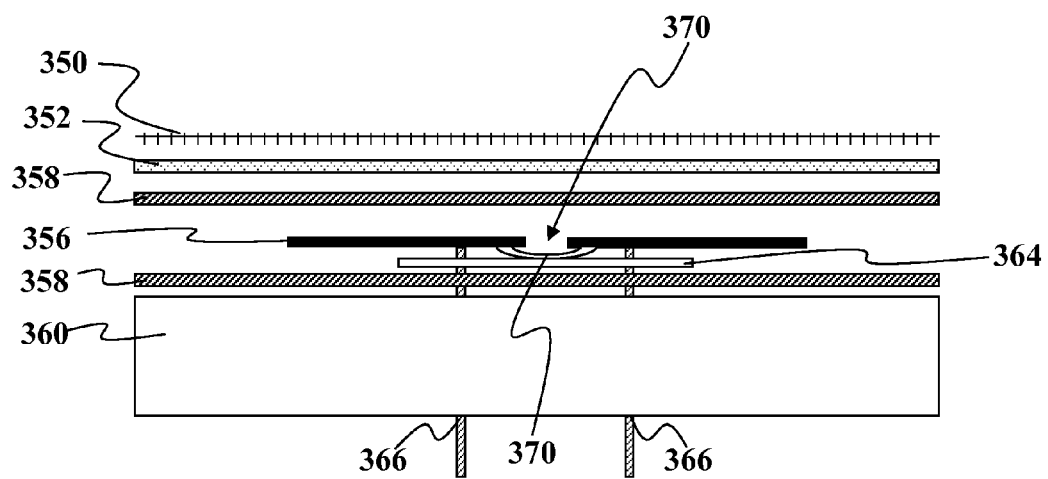
FIG. 11 shows a exploded cross-sectional view of one embodiment of the present invention.

Referring now to FIG. 11, another method of manufacturing a solar roofing assembly 200 will now be described. Again, for ease of illustration, an exploded view is provided to more clearly show the various elements. This embodiment of the present invention includes a plurality of layers laminated or otherwise formed with the photovoltaic cells over the roofing membrane. Specifically, as seen in FIG. 11, the method may involve using a screen 350 over a top layer 352 to provide texturing of the layer 352. The texturing may advantageously provide some anti-reflective qualities that improve photovoltaic performance of the underlying device. Optionally, some embodiments may not use the texturing. The top layer 352 in the present invention may be a layer of ETFE or optionally, it may be a multi-ply laminate of various materials optimized to provide specific protective qualities. In still further embodiments, the layer 352 may be a clear or substantially transparent PVC layer. This may be advantageously from a thermal expansion perspective as the underlying roofing membrane may also be a PVC material and the two layers would have very similar coefficients of thermal expansion. An adhesive layer 354 may be used to couple the top layer 352 to the underlying photovoltaic cells 356. As a nonlimiting example, the adhesive layer 354 may be a layer of ethyl vinyl acetate (EVA) in a thickness of about 0.009 inches. A second adhesive layer 358 may also be used to couple the photovoltaic cells to the roofing membrane 360. It should be understood that the roofing membrane 360 may be made from any of the single-ply, double-ply, triple-ply, or multiple-ply material described herein. The cells 360 are coupled in series by connector 362. An insulating layer 364 of EVA may also be provided to seal the cell exit terminals 366 leading away from the cells 360. The cell exit terminals 366 may extend outward through the roofing membrane 360 to allow for electrical connections to be made to the embedded cells 360. Since the cells are coupled in series, it should be understood that not every cell needs to have cell exit terminals 366. Typically, these cell exit terminals 360 are found at the end of a string of cells to allow for connection to another string of cells 360. It should also be understood that the cells 360 may be spaced apart by a gap 370 which may be of a length selected to facilitate bending between adjacent cells 360.

With the layers configured as described in FIG. 11, a standard lamination process may be used to bring the layer together. In this current embodiment, a four minute evacuation cycle followed by an eight minute press cycle may be used. The press cycle may occur with temperature set at about 145° C. The press may be used with Teflon-coated fiberglass release sheets on front and back to prevent adhesion to the layers being laminated. It should be understood that the press time, press temperature, and evacuation time may all be varied as desired depending on the materials being used for the laminate.

Figure 12:
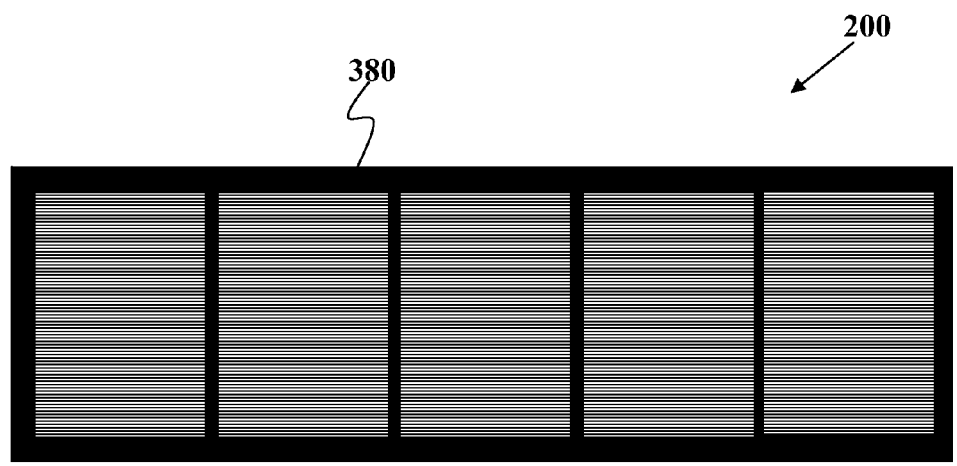
FIGS. 12, 13A, and 13B show still further embodiments of the present invention.

Referring now to FIG. 12, the operation and performance of the solar cell 360 may be improved if the temperature of the roofing membrane and surround material are reduced. About 45% of the solar energy spectrum lies in the infrared region and exposure to infrared energy tends to heat the exposed object. Unfortunately, increasing the operating temperature of the solar module will decrease cell performance, in particular negatively impacting power conversion efficiency. For an object in an outdoor environment, the four main mechanisms of reflectivity, emissivity, convection, and conduction determine its temperature. Convection is largely dependant on air flow, and conduction depends on how well an object is insulated to prevent heat flows. Reflectivity and emissivity are factors that can be manipulated. To this end, an infrared (IR) reflective pigment or other material may be used to reflect away IR radiation from non-photovoltaic cell covered areas and reduce the overall temperature of the assembly.

As seen in FIG. 12, the primary purpose of IR-reflective coatings is to keep objects cooler than they would be using standard coatings. Thus, the addition of IR-reflectivity to non-solar cell covered areas 380 of the assembly 200 improves overall system performance. Suitable coatings may include mixed metal oxides (MMO) or complex inorganic colored pigments (CICP). The inorganic ceramic nature of the pigments provides resistance to high temperatures, chemicals, acids, bases, weathering, and environmental pollutants. Some embodiments of these coatings include titania particles or other particles which improve anti-reflective properties.

Shepherd Color Company has developed a line of highly engineered IR reflective products. The highest reflective pigments can be chosen for cool coatings. Once key to formulating cool coatings is to use an infrared-reflecting black pigment. In general, IR-reflective formulations incorporate Arctic Black 10C909 to lower the L value in colors made with the other Arctic colors. Alternatively, NTT-AT has developed a line of IR-reflective pigments called AT Shield. In tests comparing the AT Shield pigment against regular pigments, an IR-reflective component containing paint has a temperature different of about 26° C. for a dark brown paint relative to a similar colored paint without any IR-reflective components. If this difference in temperature is typical across a solar module, a power temperature coefficient of about 0.3% change in power conversion efficiency per change in operating temperature (° C.) for CIS films, the decreased operating temperature would improve the module power conversion efficiency by about a relative 7.8%. Thus, if a solar module with a nominal 12% efficiency was operating at a 26° C. cooler temperature than would otherwise be possible, the improvement in its power conversion efficiency would be 7.8% of 12% or an absolute power conversion efficiency difference of about 0.9%, a substantial increase in overall device performance. As an additional benefit, if the cool-running module and roofing membrane block head from being absorbed in a rooftop, then that building will require less energy for environmental control such as air conditioning, decreasing energy demands of that location.

Figure 13A:
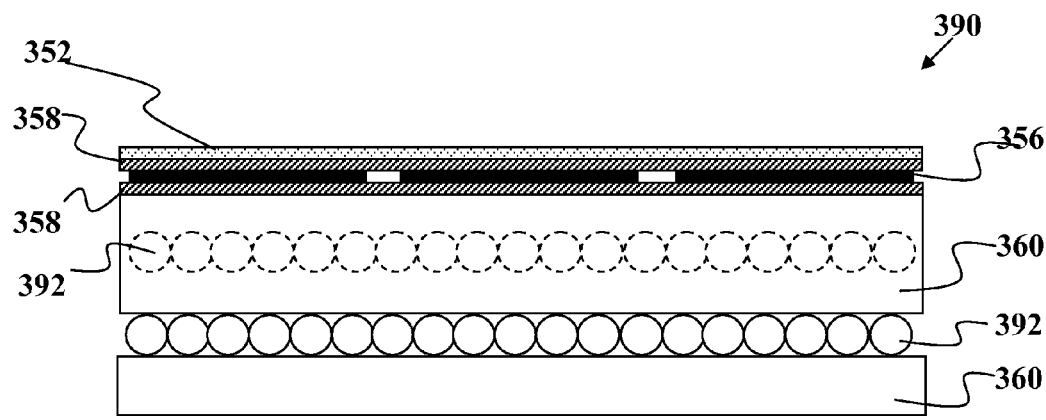

Referring now to FIG. 13A, a cross-sectional view of another embodiment of the present invention will now be described. The device 390 includes a plurality of pipes 392 positioned beneath the roofing membrane 360 to provide a cooling and/or heating option to the membrane 360. Optionally, pipes 392 may also be included in the layer 360 (as shown in phantom). In other embodiments, it should be understood that the pipes 392 may be included only in membrane 360. The pipes 392 may carry air, gas, or fluid to cool and/or heat the membrane 360. This may be particularly useful to lower the temperature of the attached photovoltaic cells 356 to a more desirable operating temperature. In some weather conditions, it may be desirable to heat the cells if the temperature outside is particularly cold so as to decrease conversion efficiency of the photovoltaic cell 356.

Figure 13B:
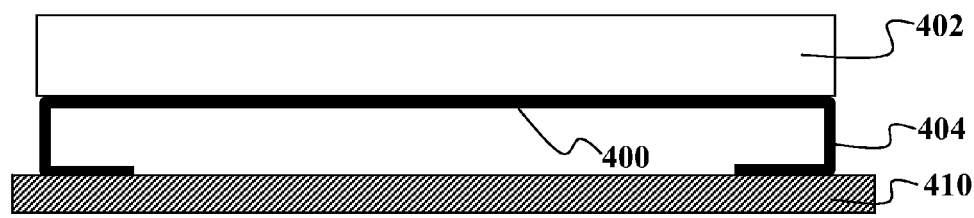

FIG. 13B shows yet another embodiment of the present invention. This embodiment shows a support structure 400 having an upper surface for supporting a photovoltaic device 402 and leg portions 404 for supporting the device 402 above a ground or other surface. This allows for air circulation beneath the device 402 to cool the device and to space it apart incase the base is warmer than the device 402. The structure 400 may be made from aluminum, steel, plastic, PVC, or other material with sufficient strength to support the photovoltaic device. The support structure 400 may optionally be angled to by having leg portions 404 of differing heights to provide the best angle for sun exposure during the day. The support structure 400 may advantageously be used with devices 402 that are with or without their own frame or support since the structure 400 will provide sufficient support to prevent the device 402 from cracking under its own weight. Some embodiments may only have on leg portion 404 and have an overall C-shaped cross-section. Other embodiments may have a corrugated and/or honeycomb design for the structure 400 to support the device 402. The corrugated and/or honeycomb design may rest on the roofing membrane 410 or be support aloft. The open design allows for air flow for cooling purposes. In embodiments where the structure is attached to a roofing membrane 410, the attachment may occur by a variety of techniques including ballasting, gluing, hot air-fusing, thermal fusing, chemical fusing, mechanical fastening, other attachment techniques, or combinations of these techniques. The surface of the leg portion 404 may be treated and/or coated to include a layer of material to facilitate adhesion (chemical, thermal, or otherwise) to the roofing membrane 410. This may be particularly useful if the material used for the structure 400 is not readily adherable with the roofing membrane 400.

Figure 14:
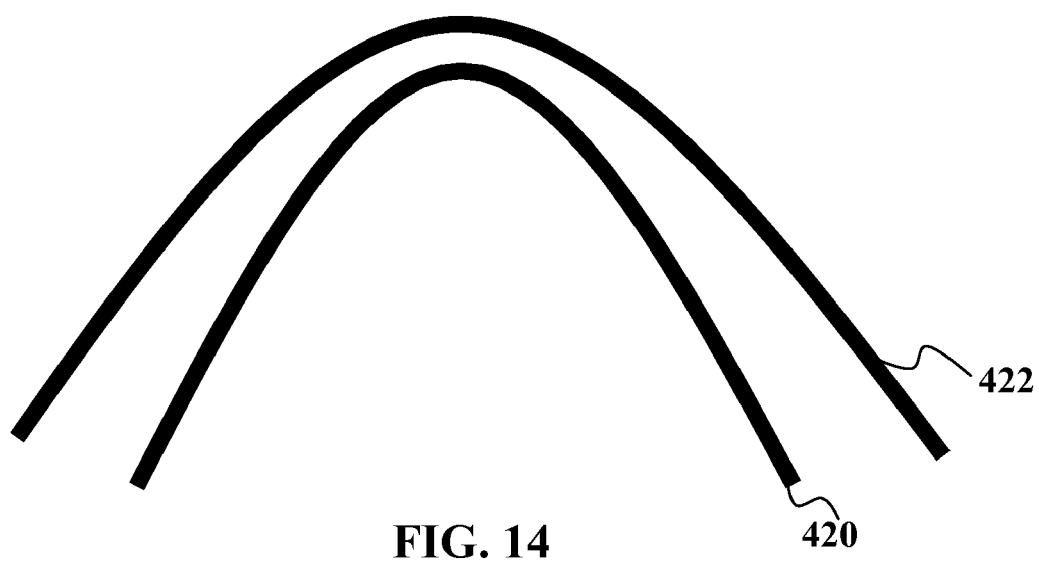
FIG. 14 shows a comparison of bent materials according to an embodiment of the present invention.

Referring now to FIG. 14, it should be understood that embodiments of the present invention may use cells 420 with a greater bending flexibility that the support roofing membrane 422. This ensures that the cells 420 do not limit the ability of the roofing membrane to follow contours of the underlying roofing structure. In one embodiment, the photovoltaic cells may be sufficiently flexible to deflect between about 1 mm to about 1000 mm radius of curvature without damaging the cells.

Figure 15:
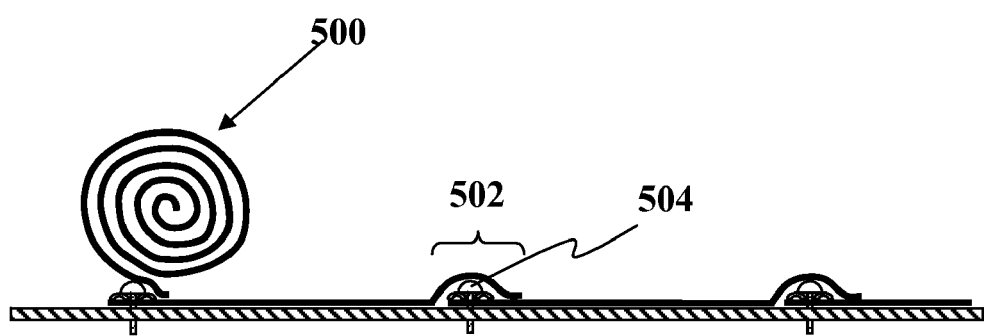
FIG. 15 shows a cross-sectional view of a still further embodiment of the present invention.

Referring now to FIG. 15, a still further embodiment of the present invention will now be described. FIG. 15 shows a roofing assembly 500 using overlapping areas 502 to join with adjacent rolls of roofing material. Electrical ports 504 may be inserted at regular intervals underneath the roofing membrane overlap areas 502 to provide electrical connection. These ports 504 may also contain mechanical fasteners such as screws or nails that form a dual purpose of securing the assembly 500 to the roofing structure and providing an electrical connection to draw away power generated by the photovoltaic cells.

Encapsulant Barrier Films

Figure 16:
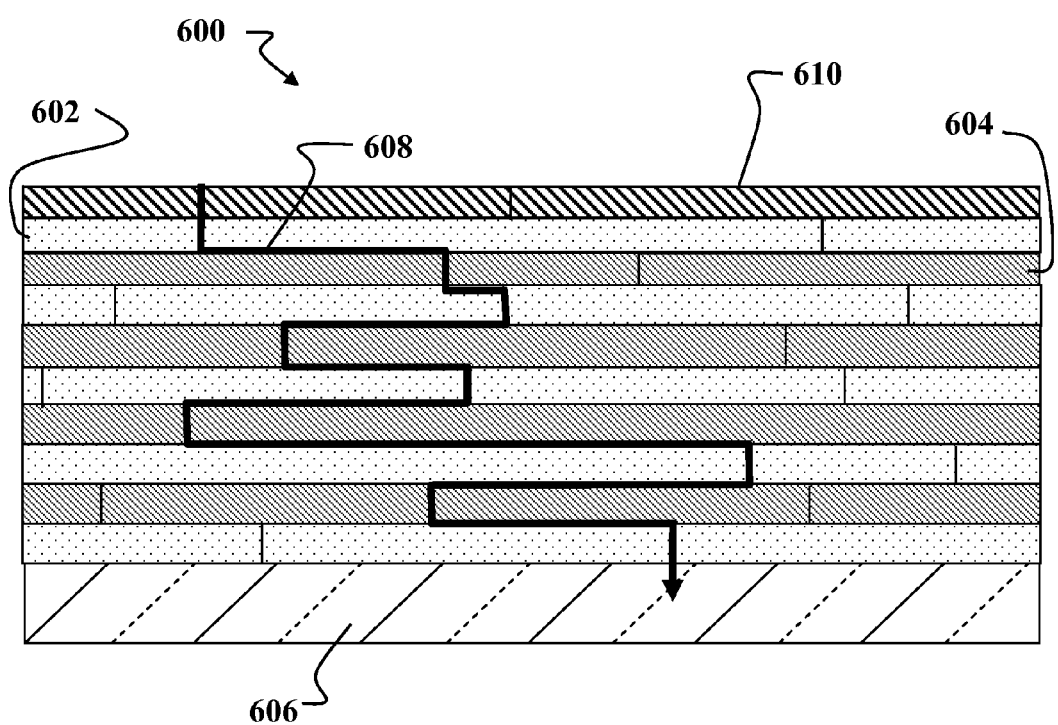
FIG. 16 shows a cross-sectional view of a nanolaminate barrier film according to one embodiment of the present invention.

Referring now to FIG. 16, it should be understood that traditional rigid encapsulants fail to be suitable for use with the flexible solar cell devices described herein. Accordingly, encapsulant films that provide sufficient environmental protection while retaining high levels of flexibility are desired.

FIG. 16 shows an embodiment of the present invention having an inorganic/organic hybrid barrier nanolaminate film and methods for making the film. The film 600, shown schematically in FIG. 16, is suitable for use with flexible solar cells and generally includes multiple alternating layers of organic material 602 and inorganic material 604. The thickness of the inorganic layers 602 and organic layers 604 can be from about 0.1 nm to about 1 nm or from about 1 nm to about 10 nm or from about 1 nm to about 100 nm. The inorganic layers 602 can be silicates, although other inorganic materials can be formed from suitable alkoxides as described below. The barrier film 600 can be made substantially transparent by appropriate choice of the number, thickness, and composition of the inorganic layers 602 and organic layers 604. Although a relatively small number of layers is shown in FIG. 16 for the sake of clarity, a barrier film for a typical device can have many more layers, e.g., several thousand.

The organic layers 604 are polymers such as polyethylene naphthalate (PEN), polyether etherketone (PEEK), or polyether sulfone. In addition, polymers created from styrene polymer precursors, methyl styrene polymer precursors, (meth)acrylate polymer precursors, both fluorinated and non-fluorinated forms of these precursors, and combinations of two or more of these precursors can be used as the organic layers 604. These organic materials are desirable because of their superior thermal properties and excellent gas barrier characteristics. Furthermore, one or more of the organic layers 604, e.g., an uppermost layer 610, may optionally be a superhydrophobic layer such as fluoroalkylsilane. Fluoroalkylsilane thin films are described, e.g., by Akira Nakajima et al., in "Transparent Superhydrophobic Thin Films with Self-Cleaning Properties", Langmuir 2000, 16, 7044-7047, which is incorporated herein by reference.

The layer structure of the barrier film 600 provides a long path for water or oxygen to penetrate the barrier film to an underlying substrate 606 or photovolatic cells, e.g., via pinholes and/or gaps at interfaces between layers as indicated by the path 608. The permeability of the nanolaminate barrier film 600 to oxygen and water vapor can be adjusted by changing the number of layers. By using hundreds to thousands of interdigitated inorganic layers 602 and organic layers 604 within the barrier film 600, the large number of layers combined with randomly located pinholes within the nanolaminate results in tortuous paths for molecules such as water vapor and oxygen that might enter from the environment outside of the barrier film 600. The more layers, the more tortuous the path for permeating molecules. Thus, the more layers, the less permeable the barrier film 600 is to water vapor and oxygen. In embodiments of the present invention, there can be 100 or more, 1000 or more, 10,000 or more or 100,000 or more individual layers in the composite barrier film 600.

Furthermore, hydrophobic groups can be incorporated into or eliminated from the polymer precursors used to form the organic layers 604 to tune (increase and/or decrease) the hydrophobicity of the resulting organic layers 604 and, in turn, adjust the permeability of the barrier film 600. For example, non-polar hydrophobic groups, including but not limited to methyl groups and benzyl (aromatic) groups, can be attached to the polymer precursors. In general, increasing ionic strength increases hydrophobic interactions. For example, the anions and cations listed below are in a series from those that highly favor hydrophobic interactions to those that decrease hydrophobic interactions.

Anions: $PO_4^{3-}$, $SO_4^{2-}$, $CH_3COO^-$, $Cl^-$, $Br^-$, $NO^-$, $ClO_4^-$, $I^-$, $SC_n^-$.

Cations: $NH_4^+$, $Rb^+$, $K^+$, $Na^+$, $Cs^+$, $Li^+$, $Mg^+$, $Ca^+$, $Ba^+$.

Any of these anions and/or cations and/or similar compounds can be incorporated into the polymer precursors, resulting in polymers with tuned hydrophobicity.

In addition, hydrophobic amino acids such as tryptophan, isoleucine, phenylalanine, tyrosine, leucine, valine, methionine, and alanine could be used as side chains for the polymer precursors.

Furthermore, Gemini surfactants (also called dimeric surfactants) are highly reactive and could be used as structure-directing agents. Gemini surfactants have two hydrophilic head groups and two hydrophobic groups in the molecule, in contrast to conventional surfactants that have only single hydrophilic and single hydrophobic groups.

By suitable choice of the number and composition of layers, the oxygen permeability of the barrier film 600 can be made less than about 1 cc/m$^2$/day, 0.1 cc/m$^2$/day, 0.01 cc/m$^2$/day, $10^{-3}$ cc/m$^2$/day, $10^{-4}$ cc/m$^2$/day, $10^{-5}$ cc/m$^2$/day, $10^{-6}$ cc/m$^2$/day, or $10^{-7}$ cc/m$^2$/day. Similarly, the water vapor permeability of the barrier film 600 can be made less than about 1 g/m$^2$/day, 0.1 g/m$^2$/day, 0.01 g/m$^2$/day, $10^{-3}$ g/m$^2$/day, $10^{-4}$ g/m$^2$/day, $10^{-5}$ g/m$^2$/day, $10^{-6}$ g/m$^2$/day, or $10^{-7}$ g/m$^2$/day.

The nanolaminate barrier film 600 can be made in a single-step (or few sequential step) process by self-assembly using sol-gel techniques. Self-assembly of nanocomposite materials using sol-gel techniques is described, e.g., in U.S. Pat. No. 6,264,741 to Brinker et al., the entire contents of which are incorporated by reference. Generally speaking, a sol can be prepared, e.g., by combining one or more alkoxides, an alcohol, water and dilute hydrochloric acid (HCl) and heating the resulting mixture. A coupling agent is then introduced to the mixture followed by a surfactant (or Gemini surfactant), in a quantity sufficient that the initial surfactant concentration is below the critical micelle concentration. Subsequently, one or more polymer precursors, e.g., monomers suitable for the formation of PEN, PEEK or polyethersulfone are then added followed by a cross-linker agent and an initiator. Alternatively, the polymer precursors can include styrene polymer precursors, methyl styrene polymer precursors, (meth)acrylate polymer precursors, either fluorinated or non-fluorinated forms of these, precursors and combinations of two or more of these precursors. A substrate is coated with the sol and the alcohol is allowed to evaporate. The alcohol evaporation drives a self-assembly reaction that forms the multilayer barrier structure described with respect to FIG. 16.

Suitable alkoxides are structured around a central element X. Suitable central elements X include Al, B, Ba, Pb, Se, Si, and Sn. Other suitable central elements X include transition metals, e.g., Ag, Au, Cd, Co, Cr, Cu, Fe, Ir, Mn, Mo, Nb, Ni, Sr, Ta, Ti, V, W, Y, Zn, Zr, etc. For silicon (Si)-based inorganic layers 602 examples of suitable alkoxides include polysiloxanes such as tetraethylorthosilicate (TEOS). For titanium (Ti)-based inorganic layers 602 examples of suitable alkoxides include titanium ethoxide or titanium isopropoxide.

By way of example, and without loss of generality, a sol can be prepared, e.g., by combining tetraethylorthosilicate (Si(OCH$_2$CH$_3$)$_4$, also known as TEOS), ethanol, water and dilute HCl (dilute so as to minimize the siloxane condensation rate) in molar ratios of 1:3.8:1:5×10$^{-5}$ respectively and heated at about 60° C. for about 90 minutes. The sol is then diluted with ethanol in a 1:2 ratio after which water and dilute HCl are added. A coupling agent such as 7-octenyltrimethoxysilane (OTS), or methacryloxypropyl trimethoxysilane (MPS) is then introduced to the mixture followed by a surfactant such as cetyltrimethylammonium bromide (CTAB) so that the initial surfactant concentration is below the critical micelle concentration. After stirring for about one hour, a monomer (e.g., 2,6-Dimethylnaphthalene (DMN; to create polyethylene naphthalate (PEN)), or a set of monomers such as bisphenol A and di-para-fluorophenylsulfone (B/FS, to create polyethersulfone) is then added followed by a cross-linker agent (such as hexanedioldimethacrylate (HDM) and an initiator. For ultraviolet initiation benzoin dimethylether (BME), can be added. For thermal initiation, 1,1'-azobis(1-cyclohexane carbonitrile) (ACHN) can be used).

To tune the chemistry of the sol, the concentration of the surfactant, water, ethanol, TEOS, and organic monomers can be varied. Annealing the films at about 200° C. or greater (but below the decomposition temperature of the organic materials) further densifies the siloxane material and improves impermeability.

Coating and Nanolaminate Self-Assembly

The substrate 606 which may be the underlying photovoltaic cells or a layer over the photovoltaic cells can be coated with the sol mixture by any suitable technique, such as but not limited to, dip coating, spin coating, spray coating, web coating, or microgravure web coating. Suitable coating machines are commercially available, e.g., from Faustel, Inc., of Germantown, Wis. In particular, a Continuous Coater Type BA from Werner Mathis AG of Zurich, Switzerland may be used to coat the substrate with the sol mixture. It is desirable to coat the substrate with the sol in a wet layer approximately 1 microns to 10 microns to 100 microns thick. Thicker wet layers, e.g., about 100 microns to about 1 millimeter thick, can also be used. Since the barrier film 600 can be fabricated without the use of vacuum equipment, the processing is simple and comparatively low in cost.

By way of example, the substrate can be rapidly coated with the sol, e.g., by dip coating (e.g., about 25 cm/min dip and withdrawal rate; for large area substrates) or spin coating (e.g., about 1500 rpm for about 1 minute for small area substrates). After coating, the ethanol component of the sol begins to evaporate, and the increasing concentrations of water and surfactant cause the surfactant concentration to exceed the critical micelle concentration, resulting in both micelle formation and the incorporation of the alcohol-soluble organic monomers into the micellar interiors. This TEOS and CTAB-based sol gel chemistry provides for self-assembly of nanostructures whose chemical backbones condense into dense, stable materials.

Evaporation-induced partitioning provides a means to promote the co-dispersion of both organic and inorganic components throughout the nascent and emerging siloxane framework of the sol gel. As the ethanol continues to evaporate, the silica-surfactant-monomer micelles self-assemble into interfacially organized liquid crystal, lyotropic mesophases on a time scale of about 10 seconds. Polymerization of the organic material in the alternating interfacial layers can be induced by either ultraviolet light or heat, which also stabilizes the polymerizing inorganic siloxane framework. The resulting nanocomposite structure in the multi-layer film is stabilized by (a) organic polymerization, (b) inorganic polymerization, and (c) covalent bonding at the organic interfacial surfaces. A single coating step can produce films at least 1000 nm thick comprised of individual layers, each roughly 1 nm thick. By taking advantage of the self-assembling nature of the materials, each set of 1000 layers can be formed in only seconds. A greater number of layers in the resulting barrier film can be obtained by repeating the coating and evaporation sequence multiple times and/or by depositing thicker coatings.

Templated Nanolaminate Layer

Figure 17:
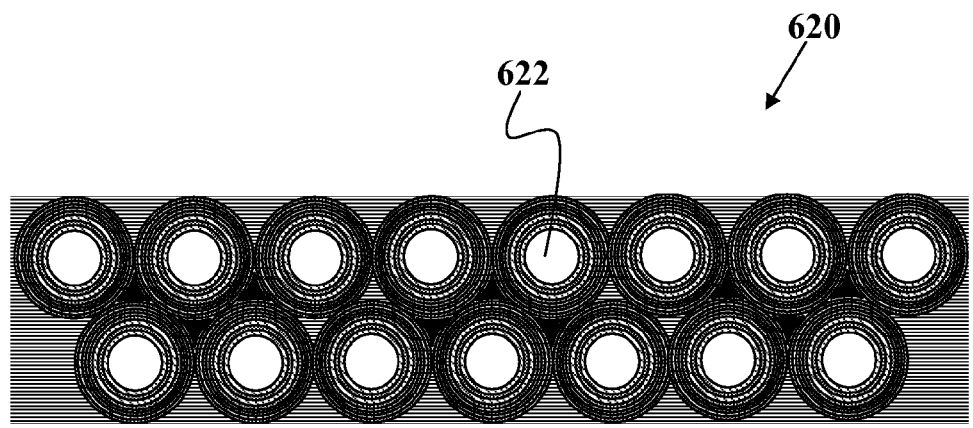
FIGS. 17 and 18 show cross-sectional views of a templated nanolaminate barrier film according to one embodiment of the present invention.

Referring now to FIG. 17, a still further embodiment of the present invention will now be described. The nanolaminate barrier film 600 described above is typically configured as a plurality of horizontal layers of silica and a hydrophobic polymer. As previously described, when contaminants such as water or oxygen enter the nanolaminate, the movement of the contaminant molecules occurs through randomly distributed pinholes in these horizontal layers. The more layers, the longer the tortuous path for contaminates to reach the other side of film 600.

The barrier qualities of such a film may be further improved by creating a templated barrier film 620. As seen in FIG. 17, the nanolaminate may be formed as a templated nanolaminate barrier film 620 through the addition of beads 622. The beads 622 may be made from a variety of materials including but not limited to silica, glass, or other transparent inorganic materials. The beads 622 may come in a variety of shapes such as spherical, platelet, flake, or the like. Although not limited to the following, the beads 622 as measured in the direction of their largest dimension may be sized between about 1 nm to about 10 microns. In one embodiment, the beads 622 are all of substantially uniform size. In other embodiments, the beads 622 are sized to be within 5-10% of each other. In still other embodiments, a wide variety of bead sizes are used. Preferably, the beads 622 are of submicron sizes.

The addition of beads 622 enhances the barrier qualities of the film by minimizing the tortuous paths passing through the film 620. Instead of the various tortuous paths leading through the film, the tortuous paths in the film 620 lead toward the individual beads 622 which are dead-end paths. With sufficiently high numbers of beads, contaminants will more likely than not follow a tortuous path to a bead 622 instead of a tortuous path that leads to the other side of the film 620. This significantly improves the quality of the barrier since even if a contaminant traverses the tortuous path, the path fails to lead to the other side of the film 620.

Figure 18:
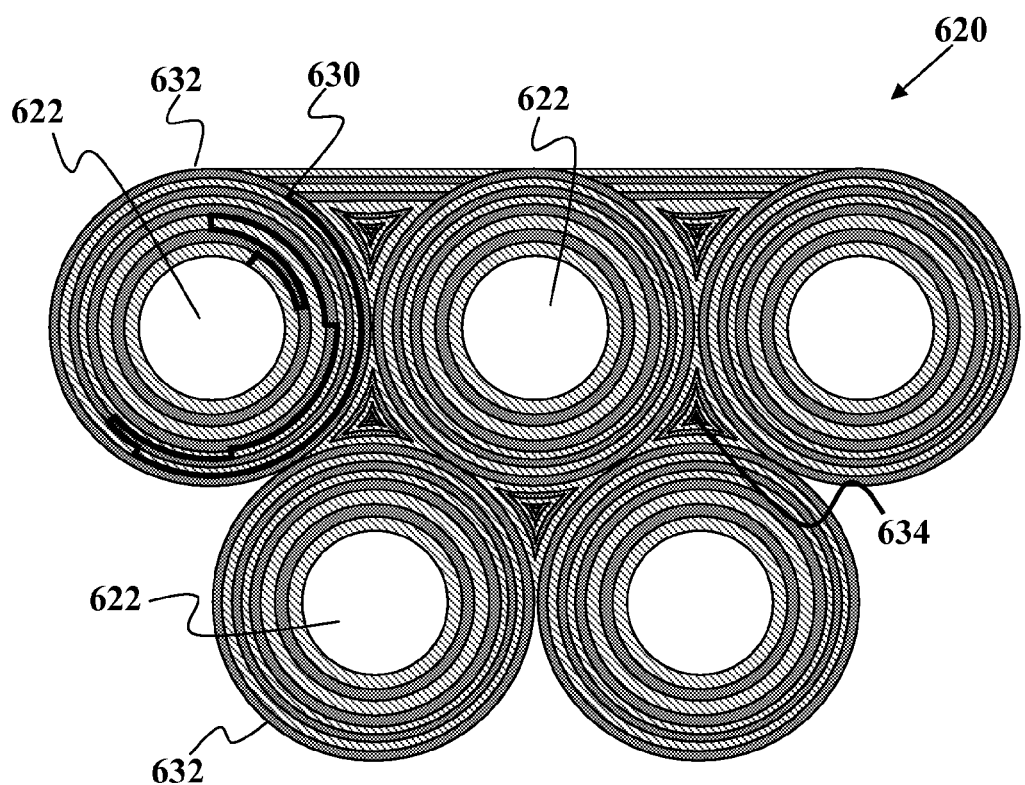

FIG. 18 is an enlarged view showing the templated nanolaminate layer 620 in more detail. As a nonlimiting example, one possible tortuous path 630 is shown leading from an outer, concentric nanolaminate layer 632 to the bead 622. Very few paths if any lead through one side of the layer 622 to the other side of the layer 622. Most paths will eventually encounter one of the many concentric layers 632 around the beads 622 and be lead toward a dead-end instead of along a path through the layer 632. Additionally, areas 634 between coated nanolaminated glass beads 622 (e.g. interstitial volume) may be non-templated nanolaminate (shown here schematically) and not open voids.

By way of example and not limitation, the concentric nanolaminate layer 632 may alternate between an inorganic layer and an organic layer. In one embodiment, the nanolaminate layers 632 may be 1 nm thick layers alternating between layers of SiO2 and layers of hydrophobic polymer. Other self-assembled layers may have other configurations with variations on the number of alternating layers.

The use of beads 622 in the templated nanolaminate will advantageously provide at least some of the following benefits. As a nonlimiting example, incorporation of solid glass beads 622 allows for higher average glass density in the overall film since bead glass will be higher density (2 g/cc)

than sol-gel glass (1.7 g/cc). Additionally, unlike non-templated nanolaminate layers, templated nanolaminate film will drive contaminants such as water or oxygen vapor molecules from the outside of the coating to the bead, where contaminant molecules become trapped and cannot easily exit the film. Since the only way the contaminant molecules can exit are through those same entry paths (molecular waveguides), and by exiting, they block further entry of other molecules. Accordingly, the steady-state permeation rate will be low on average throughout the structure. As a further advantage, the tortuous path length per unit coating volume should also increase through the use of the beads 622.

By way of example and not limitation, these beads 622 may be added to the dispersion before, during, and/or after solution coating of the material for forming a nanolaminate film similar to that for forming film 620. With the beads 622 present during the self assembly process, the concentric nanolaminate layers may form around the beads 622 to create the templated nanolaminate barrier film 620. The beads 622 may be in the form of a dry powder and/or in a dispersion added to another dry powder, dispersion, and/or emulsion. The suspension may be applied over the photovoltaic cells or other layer by any of a variety of solution-based coating techniques including, but not limited to, wet coating, spray coating, spin coating, doctor blade coating, contact printing, top feed reverse printing, bottom feed reverse printing, nozzle feed reverse printing, gravure printing, microgravure printing, reverse microgravure printing, comma direct printing, roller coating, slot die coating, meyerbar coating, lip direct coating, dual lip direct coating, capillary coating, ink jet printing, jet deposition, spray deposition, and the like, as well as combinations of the above and/or related technologies.

Fused Silica

Figure 19A:
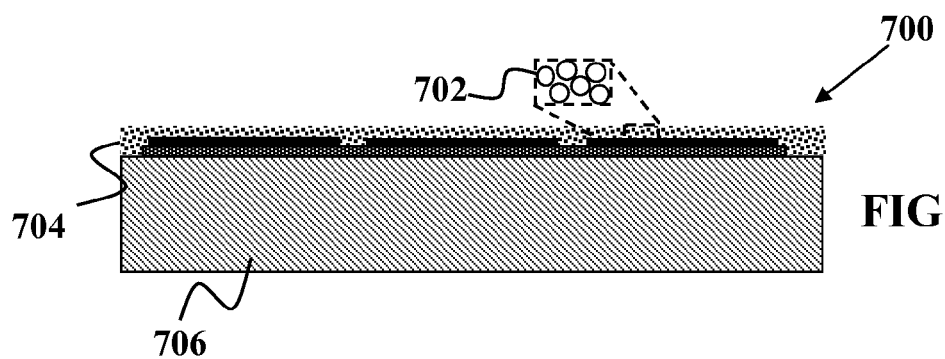
FIGS. 19A and 19B show a barrier film having fused particles according to one embodiment of the present invention.
Figure 19B:
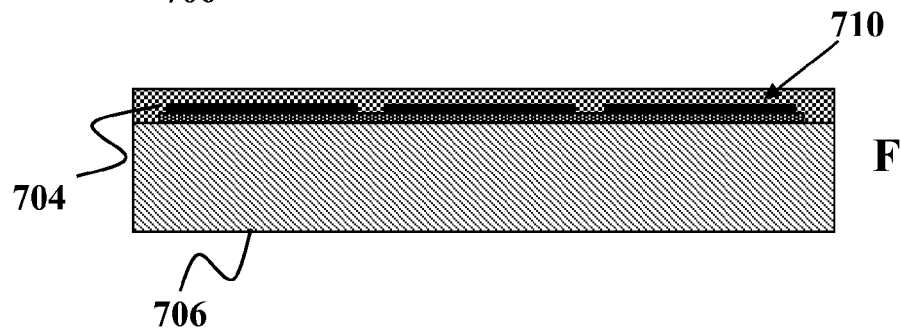

Referring now to FIGS. 19A and 19B, the present invention also discloses methods of providing an encapsulating layer for flexible solar cells which has good permeability barrier properties, mechanical toughness, and stability under UV irradiation. In a preferred embodiment seen in FIG. 19A, the unfused barrier layer 700 is comprised of silica particles 702 (shown more clearly in the enlarged portion of FIG. 19A), which may have nanometer scale dimensions, which are fused to form a good barrier. The underlying photovoltaic cells 704 are supported on a support layer 706. If the particles 702 are spherical (or approximately so), and of submicron diameter, then they touch in many places, and even a small degree of fusing (not enough to eliminate all free volume) is sufficient to create a long, tortuous path for diffusing gas molecules.

Referring now to FIG. 19B, the fusing of particles 702 results in the fused barrier film 710 and this may be accomplished by several methods. One method is by application of a short, intense pulse of heat (from a laser, for example), which is short enough so that heating and cooling take place on a microsecond or shorter time scale, and this time is insufficient for chemical damage to occur to an underlying layer. Such short-pulse thermal treatment has been applied to the recrystallization of silicon on polymer films, for example, as described in U.S. Pat. No. 5,346,850 issued to J. L. Kaschmitter, et al.

A second method is by the decomposition of a soluble precursor of silica (or a similar inorganic dielectric material) into which the particles have been dispersed. Spin on glass (SOG) precursors such as dimethylsiloxane may be used, for example. With a high particle loading of the dispersion, a coating can be made in which the particles occupy most of the volume, while the fluid occupies the interstitial volume and a thin coating on the particles. When this film is heated to decompose the SOG precursor, the space not originally occupied by solid silica spheres or other particles is now occupied by SOG, which although not ideally impermeable, is of sufficiently low permeability to severely impede the diffusion of vapor molecules through the small cross-section paths in between particles.

A third method is by the decomposition of vapor phase precursors, especially in a high-density plasma such as described by J. R. Sheats, et al., in U.S. Pat. No. 6,146,225, issued Nov. 14, 2000, entitled "Transparent, flexible permeability barrier for organic electroluminescent devices". Such plasmas enable the deposition of dense dielectric films at low temperatures. When combined with a pre-existing layer of silica (or other dielectric) nanoparticles, the plasma-deposited film can fill in the interstitial spaces with a dense and highly impermeable material. The combination of the two materials results in a much faster and more economical process since the majority of the volume is occupied by the particles and this volume does not have to be deposited by the relatively slow and expensive plasma process.

Other types of conventional barrier coatings on polymers, such as described by J. D. Affinito and D. B. Hilliard in U.S. Appl. No. 20050051763, "Nanophase multilayer barrier and process", and by A. G. Erlat, et al., in the Proceedings of the SVC, 2005, pp. 116-120, and T. W. Kim, et al., US. Appl. No. 20060003189, "Barrier coatings", may also be applied to solar cell packaging. Additionally, multilayer composites such as those described by the tradename "ORMOCER" and developed by the Fraunhofer Institute for Silicate Research, Neunerplatz 2, Wuerzburg, Germany, and disclosed in U.S. Pat. No. 6,503,634 may be advantageously used.

These polymer-based composite films provide reduced permeability compared to the original polymers while preserving transparency; and the inorganic layers are chemically and photochemically stable. However, they all make use of vacuum deposition processes to provide the inorganic layer, which is necessary to achieve substantial barrier properties. This disadvantage is overcome in the present invention in two ways: 1) by substitution of much of the barrier layer volume by solid particles which are deposited from a liquid dispersion, and 2) by the use of atmospheric-pressure processes for filling the remaining voids.

In addition to the methods of solution precursor deposition and plasma processing previously described, a further embodiment of the present invention makes use of atmospheric plasma chemical vapor deposition, using equipment that is sold for example by Surfx Technologies LLC, 3617 Hayden Avenue, Culver City, Calif. 90232. Silica films can be deposited by this technique over large areas at substantially higher rates than with conventional plasma enhanced chemical vapor deposition (PECVD), with lower cost due to the absence of need for vacuum.

Figure 20:
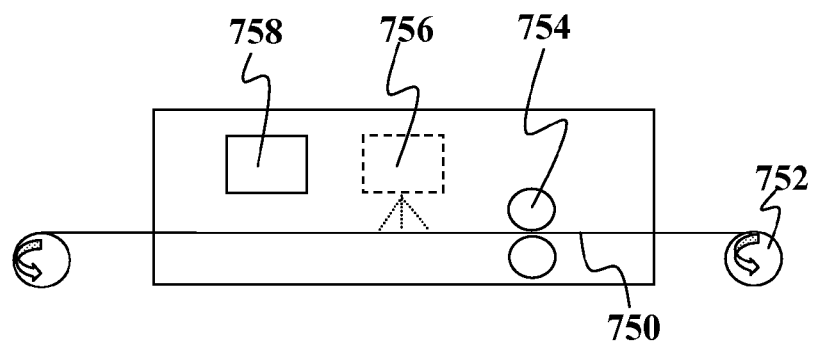
FIG. 20 shows a high-throughput manufacturing process according to one embodiment of the present invention.

Referring now to FIG. 20, it should be understood that the above methods may use non-vacuum based techniques to form the encapsulant film. This advantageously allows the use of various high-through processes such as but not limited to a roll-to-roll process. The ability to avoid the vacuum process allows for higher processing speeds. FIG. 20 shows that a roll of photovoltaic roofing membrane 750 on a supply roll 752 will be sent into processing. Depending on the process used to form the encapsulant film, the process may use a solution deposition process at station 754 and/or a dry powder deposition process at station 756 (shown in phantom). It should be understood that other stations may be added to provide other non-vacuum processes. A heating station 758 may be used to provide rapid thermal processing (RTP) or other thermal processing at temperature or duration below that which may damage the underlying photovoltaic cells. It should be understood that for any of the foregoing, the stations may be located both above and/or below the membrane 750. The processes are not limited to use with flexible membranes and may be equally suitable for high throughput processing of rigid substrates.

Edge Tape

In a still further embodiment of the present invention, devices and methods are provided to address any lateral ingress of vapor between the top and bottom protective sheets, through the polymer which encapsulates the cells. Traditionally, various edge sealing tapes, such as TruSeal, have been developed to fill this need. However, these add cost, are not easy to apply in an automated, low-cost manufacturing process, and are soft and easily squeezed out during lamination. They are typically 7 to 12 mm wide, which consumes valuable module area. In addition, they are comprised of polymers which, while of lower permeability than the preferred encapsulants, are still much more permeable than is desirable. Approaches which add a highly impermeable barrier film need to do so at a temperature low enough to avoid damage to the cell; for CIGS this is about 150° C. In addition, the constraints of process cost already mentioned are still pertinent; thus it is undesirable to introduce such processes as PECVD.

In the present invention, the impermeable barrier is advantageously supplied by a very thin coating of dielectric, for example aluminum oxide or alumina, formed by the process of atomic layer deposition (ALD). ALD is capable of depositing films of unusual perfection, covering defects with minimal pinhole or nanopore formation. It is used, for example, to deposit gate dielectrics for silicon transistors in which the film can be only a few atomic layers thick (e.g. 10-15), and any pinholes, even of a few angstroms in extent, would lead to device degradation.

M. D. Groner, et al., in the journal *Applied Physics Letters*, vol. 88, p. 051907 (2006), demonstrate that the water vapor permeability of a foil of poly(ethylene naphthalate), or PET, is reduced at least 10,000× by a layer of 10 nm of alumina deposited by ALD. The final value of $\sim 10^{-3}$ g/m$^2$/day is sufficiently low to be a valuable barrier for the protection of CIGS solar cells. The deposition temperature used in these experiments was 125° C. Even lower temperatures appear useful.

Such thin barrier layers can be deposited on protective polymers. However, they can also be deposited directly on the surface of the solar cell, thereby providing the essentially hermetic seal that eliminates the edge permeation problem. The cells can then be encapsulated in a conventional way (for example with EVA, or some other polymer), and covered with a thin protective topsheet whose permeability is not critical; thus it can be chosen for its mechanical strength, transparency and photochemical stability. The encapsulant will adhere to such a barrier layer with a strength similar to that obtained with the glass and transparent conducting oxide (TCO) which it normally contacts.

It will be particularly advantageous if the barrier layer is deposited after the cells have been connected in a series string, so that the only protrusion from the coating is comprised of the tabbing metal which is used to connect the string to the next string in the module.

A further advantage of the barrier layer is that it protects the surface of the cell against mechanical damage during handling as it is being put into a module. Even though it is very thin, alumina is quite hard, and is therefore a more effective protective layer than the TCO.

The described barrier layer also has desirable dielectric properties. Because of the high quality (density, uniformity and low polarity) of the material, its insulating qualities are equivalent to much thicker layers of encapsulating polymers such as EVA (whose resistivity is ~1000× lower than the best polymer insulators). Thus, the amount of encapsulant polymer can be reduced, saving cost, and the cells can be placed closer together, thereby increasing the efficiency of the module.

Yet another barrier layer which can be deposited directly onto the cell is the self-assembled nanolaminate described in U.S. Appl. No. 20050095422, by B. M. Sager and R. M. Roscheisen.

An alternative to silica particles is provided by nanostructured thin films of dielectric materials. For example, V. Z-H. Chan, et al., in *Science, vol.* 286, pp. 1716-1718 (1999), describe a film of a block copolymer of 33% polyisoprene, 67% poly(pentamethyldisilylstyrene), which when treated to UV and ozone at ambient temperatures is converted to an interpenetrating network of nanoscale pores which are stable to >400° C. and have a refractive index equal to fully dense $SiO_2$. The remaining free volume can be filled with the fluid silica precursors disclosed above to provide a highly impermeable thin transparent film at low temperatures. Many other block copolymers with similar chemical behavior are known and can be used in the same manner.

While the invention has been described and illustrated with reference to certain particular embodiments thereof, those skilled in the art will appreciate that various adaptations, changes, modifications, substitutions, deletions, or additions of procedures and protocols may be made without departing from the spirit and scope of the invention. For example, with any of the above embodiments, elements might be created in situ rather than pre-formed. With any of the above embodiments, elements might be partially created at on stage in the process and finished later in the process. With any of the above embodiments, the term foil can include both metallic foil and non-metallic foil. With any of the above embodiments, the term "rolled up" can include combinations of roll bends and other packing methods such as folds, fanfolds, rounded folds, and rounded fanfolds. Some embodiments of the present invention may not use an EVA layer and/or other adhesive layer between the roofing membrane and the photovoltaic cells, relying instead on the adhesive qualities of the roofing membrane. Still other embodiments may use photovoltaic cells that are pre-treated and encapsulated in EVA and/or other material to facilitate adhesion to the roofing membrane. Still other embodiments, the roofing membrane may include buckles, buttons, leads, metallic bumps, or other connectors to facilitate pre-fabricated electrical connections in the device to simplify electrical connection between photovoltaic assembly and electrical conduits coupled to, underneath, above, integrated with, or sandwiched between the roofing membrane. It should be understood that the web or substrate used with the present invention for the solar cells may be up to 1 m wide, up to 2 m wide, up to 3 m wide, or wider.

Conformal or non-conformal nanolaminate barrier coatings of the type described above can be applied to a variety of planar and non-planar surfaces, in two- and three-dimensions. More specifically, this nanolaminate approach could be used to encapsulate and or protect optoelectronic devices (e.g., LEDs, solar cells, FETs, lasers), pharmaceutical products (tablets in packages, etc), medical devices, food products (packaged foods, beverages, candies), display screens (touch panel displays, flat panel displays), and electroluminescent windows and other windows and transparent films and coatings, as well as the chassis for appliances used in rugged environments.

The publications discussed or cited herein are provided solely for their disclosure prior to the filing date of the present application. Nothing herein is to be construed as an admission that the present invention is not entitled to antedate such publication by virtue of prior invention. Further, the dates of publication provided may be different from the actual publication dates which may need to be independently confirmed. All publications mentioned herein are incorporated herein by reference to disclose and describe the structures and/or methods in connection with which the publications are cited. The following related applications are fully incorporated herein by reference for all purposes:

While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents. Any feature, whether preferred or not, may be combined with any other feature, whether preferred or not. In the claims that follow, the indefinite article "A", or "An" refers to a quantity of one or more of the item following the article, except where expressly stated otherwise. The appended claims are not to be interpreted as including means-plus-function limitations, unless such a limitation is explicitly recited in a given claim using the phrase "means for."

What is claimed is:

1. A manufacturing method comprising:
    providing a plurality of photovoltaic cells;
    forming at least one flexible encapsulant film protecting at least one of the plurality of photovoltaic cells from environmental exposure damage, wherein the encapsulant film is formed using a non-vacuum process to self-assemble a plurality of nanolaminate layers over at least one of the cells and including a plurality of beads present during self-assembly of the nanolaminate layers, wherein self-assembly in the presence of the beads creates nanolaminate layers each having a plurality of randomly distributed pinholes therein which define a plurality of tortuous paths leading to the beads in the nanolaminate layers.

2. The method of claim 1 further comprising incorporating one or more hydrophobic groups into polymer precursors used for self-assembly of the nanolaminate layers.

3. The method of claim 1 wherein the forming step comprises:
    combining an alkoxide, an alcohol, and water dilute HCl into a mixture and heating the mixture;
    introducing a coupling agent to the mixture,
    introducing a surfactant to the mixture in a quantity sufficient that an initial surfactant concentration is below a critical micelle concentration;
    adding to the mixture one or more polymer precursors suitable for the formation of a polymer selected from the group of, polyethylene naphthalate (PEN), polyether etherketone (PEEK), polyether sulfone (PES), fluorinated or non-fluorinated styrene polymer precursors, fluorinated or non-fluorinated methyl styrene polymer precursors, fluorinated or non-fluorinated (meth)acrylate polymer precursors, and combinations and/or derivatives of two or more of these precursors;
    adding a cross-linker agent and an initiator to the mixture;
    coating a substrate with the mixture; and
    allowing the alcohol to evaporate so that a sol forms a film having alternating organic and inorganic layers.

4. The method of claim 1 wherein the beads comprise of a silica containing material.

5. The method of claim 1 wherein the beads have a higher density than 1.7 g/cc.

6. The method of claim 1 wherein the beads are sized in a range of about 1 nm to about 10 microns.

7. The method of claim 1 wherein the beads have portions of the nanolaminate layers formed concentrically about each of the beads.

8. The method of claim 1 wherein the plurality of nanolaminate layers formed concentrically about each of the beads alternate between layers of inorganic material and layers of organic material.

9. The method of claim 1 wherein the nanolaminates layers are templated-nanolaminate layers that define a plurality of tortuous paths from an outside of the nanolaminate layers towards one or more of the beads.

10. The method of claim 1 wherein the nanolaminates layers are templated-nanolaminate layers drive contaminants penetrating an outer surface of the nanolaminate layers towards one of the beads, wherein contaminant molecules are trapped when the molecules reach the bead and cannot exit.

11. The method of claim 8 characterized by a plurality of randomly distributed pinholes in the concentric nanolaminate layers about each the beads, wherein the pinholes define a plurality of tortuous paths that impede contaminant penetration and direct contaminants away from the photovoltaic cells and towards the beads.

* * * * *